(12) United States Patent
Park et al.

(10) Patent No.: US 11,398,183 B2
(45) Date of Patent: Jul. 26, 2022

(54) DISPLAY DEVICE

(71) Applicant: LG Display Co., Ltd., Seoul (KR)

(72) Inventors: JongJin Park, Gyeonggi-do (KR);
EuiYeol Oh, Seoul (KR);
ByeongHyeon Na, Seoul (KR);
Jungwon Ryu, Seoul (KR); Hankyeol Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/391,645

(22) Filed: Aug. 2, 2021

(65) Prior Publication Data

US 2022/0044623 A1 Feb. 10, 2022

(30) Foreign Application Priority Data

Aug. 6, 2020 (KR) .................. 10-2020-0098862

(51) Int. Cl.
*G09G 3/32* (2016.01)
*H05K 1/18* (2006.01)

(52) U.S. Cl.
CPC ............. *G09G 3/32* (2013.01); *H05K 1/189* (2013.01); *G09G 2310/027* (2013.01); *G09G 2330/04* (2013.01); *G09G 2360/16* (2013.01); *G09G 2380/02* (2013.01); *H05K 2201/10128* (2013.01)

(58) Field of Classification Search
None
See application file for complete search history.

(56) References Cited

U.S. PATENT DOCUMENTS

| | | | | |
|---|---|---|---|---|
| 9,076,387 B1 * | 7/2015 | Lee | ............... | G09G 3/3258 |
| 2016/0189614 A1 * | 6/2016 | Tani | ............... | G09G 3/3291 |
| | | | | 345/76 |
| 2016/0189628 A1 * | 6/2016 | Choi | ............... | G09G 3/3233 |
| | | | | 345/77 |
| 2016/0189629 A1 * | 6/2016 | Jin | ............... | G09G 3/3233 |
| | | | | 345/76 |
| 2016/0351096 A1 * | 12/2016 | Tani | ............... | G09G 3/3233 |
| 2017/0061892 A1 * | 3/2017 | Jung | ............... | G09G 3/3291 |
| 2017/0092195 A1 * | 3/2017 | Jung | ............... | G09G 3/3258 |
| 2017/0124947 A1 * | 5/2017 | Kim | ............... | G09G 3/3233 |
| 2017/0132977 A1 * | 5/2017 | Kim | ............... | G09G 3/3291 |
| 2018/0350305 A1 * | 12/2018 | Kim | ............... | G09G 3/006 |

(Continued)

*Primary Examiner* — Fred Tzeng
(74) *Attorney, Agent, or Firm* — Fenwick & West LLP

(57) ABSTRACT

A display device is disclosed that provides a compensation function using a movable sensor structure. The display device may sense luminance characteristics of subpixels and reduce or eliminate luminance deviations between subpixels without performing complicated sensing driving on subpixels of the display panel. The display device includes: a display panel including data lines, a gate lines, and subpixels, each of the subpixels including a light emitting device and a driving transistor; a housing protecting the display panel; a moving bar installed in the housing so as to be movable and moving at a front of a viewing surface of the display panel; sensor modules mounted on the moving bar to face the viewing surface of the display panel; and a sensing controller configured to control movement of the moving bar, control an operation of the sensor modules, and receive sensing values of each of the sensor modules.

20 Claims, 33 Drawing Sheets

(56) References Cited

U.S. PATENT DOCUMENTS

| | | | |
|---|---|---|---|
| 2020/0043420 A1* | 2/2020 | Kang | G09G 3/3225 |
| 2020/0074939 A1* | 3/2020 | Kim | G09G 3/3233 |
| 2020/0160794 A1* | 5/2020 | Park | G09G 3/3233 |

* cited by examiner

DISPLAY DEVICE

CROSS-REFERENCE TO RELATED APPLICATIONS

This application claims the benefit and priority from Republic of Korea Patent Application No. 10-2020-0098862, filed in the Republic of Korea on Aug. 6, 2020, the entire contents of which are hereby incorporated by reference its entirety.

BACKGROUND

Technical Field

The present disclosure relates to a display device.

Description of the Related Art

Among the display devices currently being developed, there is a self-luminous display device in which the display panel emits light by itself. In order to emit light by itself, a display panel of such the self-luminous display device may include subpixels including a light emitting device and a driving transistor for driving the light emitting device.

Each of circuit elements such as driving transistors and light emitting devices arranged on the display panel of the self-luminous display device has unique characteristic values. For example, the driving transistor has intrinsic characteristic values such as threshold voltage and mobility, and the light emitting device has intrinsic characteristic values such as threshold voltage.

The circuit elements in each subpixel are degraded according to the driving time, so that their unique characteristic values may change. There may be a difference in driving time for each subpixel, and due to this, the degree of change in characteristic values between circuit elements of the subpixels may be different. Accordingly, as the driving time elapses, a variation in characteristic values of the subpixels may occur, and thus a variation in luminance between the subpixels may occur. The luminance deviation between the subpixels degrades the luminance uniformity of the display panel, and may eventually become a major factor causing the image quality to deteriorate.

Accordingly, various compensation techniques have been developed to sense and compensate for luminance deviations between subpixels. However, in the case of the currently developed compensation technologies, it is necessary to have a complicated subpixel structure and a complicated signal wiring structure for sensing luminance deviation between subpixels. A driving method for sensing characteristic values of subpixels having such a complicated structure may also be complex.

SUMMARY

The present disclosure provides a display device that senses luminance of subpixels and compensates for luminance deviations of subpixels without a complicated subpixel structure and a complicated signal wiring structure, and without performing complicated sensing driving.

The present disclosure provides a display device having a movable sensor structure outside a display panel and performing an accurate compensation function by using the movable sensor structure.

The present disclosure provides a display device including a display panel having a high aperture ratio and high resolution by sensing luminance of subpixels and compensating for luminance deviations of subpixels without a complicated subpixel structure and a complicated signal wiring structure.

According to aspects of the present disclosure, there is provided with a display device including: a display panel including a plurality of data lines, a plurality of gate lines, and a plurality of subpixels, each of the plurality of subpixels including a light emitting device and a driving transistor; a housing protecting the display panel; a moving bar installed in the housing so as to be movable and moving at the front of a viewing surface of the display panel; a plurality of sensor modules mounted on the moving bar to face the viewing surface of the display panel; and a sensing controller configured to control movement of the moving bar, control an operation of the plurality of sensor modules, and receive sensing values of each of the plurality of sensor modules.

The moving speed of the moving bar may be constant.

Alternatively, the moving speed of the moving bar may be variable. In this case, the moving speed of the moving bar may increase or decrease according to the operation of the plurality of sensor modules.

The display device may further include a moving actuator device that allows the moving bar to move up and down at the front of the viewing surface of the display panel.

The moving actuator device may include a first shaft installed on an upper side of the display panel, a second shaft installed on a lower side of the display panel, a first wire having a first end coupled to the left side of the first shaft and a second end coupled to the left side of the second shaft to interlock the first shaft and the second shaft, a second wire having a first end coupled to the right side of the first shaft and a second end coupled to the right side of the second shaft to interlock the first shaft and the second shaft, a first motor rotating the first shaft, and a second motor rotating the second shaft.

The left side of the moving bar may be coupled to the first wire. The right side of the moving bar may be coupled to the second wire.

As the second shaft rotates by the second motor, the first wire and the second wire may be wound around the second shaft, and the moving bar may descend. As the first shaft rotates by the first motor, the first wire and the second wire may be wound around the first shaft, and the moving bar may rise.

The moving bar may comprise a gap maintaining device that allows a gap between the plurality of sensor modules and the display panel to become a constant operable distance. The gap maintaining device may comprise at least one fan device that sucks and discharges air in the space between the display panel and the moving bar, and two or more spacers protruding toward the display panel.

Each of the plurality of sensor modules may include a luminance sensor configured to sense a luminance of a point located on the viewing surface of the display panel according to the movement of the moving bar, and an light controller positioned between the display panel and the luminance sensor, in which light emitted from the display panel is incident, and light within a predetermined angle with a vertical direction of the display panel is output.

For example, the light controller may include at least one of a first light control film that filters light in a first direction and a second light control film that filters light in a second direction crossing the first direction.

For another example, the light controller may include an optical filter including a transmissive layer and a non-transmissive layer. The non-transmissive layer may include at least one of a front non-transmissive layer positioned on the front surface of the transmissive layer and a rear non-transmissive layer positioned on a rear surface of the transmissive layer. A plurality of first slits may be formed in the front non-transmissive layer, and a plurality of second slits may be formed in the rear non-transmissive layer in a direction crossing the plurality of first slits.

In the moving bar, a plurality of sensor modules may be arranged in one row or in two or more rows.

The plurality of subpixels may include a plurality of subpixel rows. The horizontal length of the moving bar may be greater than or equal to a row direction length of one subpixel row among the plurality of subpixel rows. The vertical length of the moving bar may be greater than or equal to a column length of one subpixel row among the plurality of subpixel rows or greater than or equal to a column direction lengths of two or more subpixel rows among the plurality of subpixel rows.

At one time point in the period during which the moving bar moves, one subpixel of the plurality of subpixels may overlap one sensor module or two or more sensor modules.

The sensing controller may be configured to: control to display a sensing image on the display panel, control at least one of a moving speed and a moving direction of the moving bar; control a sensing operation of each of the plurality of sensor modules; receive sensing values for luminance from each of the plurality of sensor modules; and store information in a look-up table or change information previously stored in the look-up table based on the sensing values received from each of the plurality of sensor modules.

While the moving bar is moving, the sensing image may be displayed in an entire area or only one or more partial areas of the display panel.

While the moving bar is moving, an area in which the sensing image is displayed on the display panel may move according to a movement of the moving bar.

The display device may further include a data driving circuit configured to drive the plurality of data lines and a display controller configured to supply image data to the data driving circuit based on the image signal input from a host module.

When the image signal is not supplied from the host module to the display controller, the moving bar may move and the plurality of sensor modules may operate.

The plurality of sensor modules and the sensing controller may communicate with each other through a wired method or a wireless method.

According to aspects of the present disclosure, it is possible to provide a display device that senses luminance of subpixels and compensates for luminance deviations of subpixels without a complicated subpixel structure and a complicated signal wiring structure, and without performing complicated sensing driving.

According to aspects of the present disclosure, it is possible to provide a display device having a movable sensor structure outside a display panel and performing an accurate compensation function by using the movable sensor structure.

According to aspects of the present disclosure, it is possible to provide a display device including a display panel having a high aperture ratio and high resolution by sensing luminance of subpixels and compensating for luminance deviations of subpixels without a complicated subpixel structure and a complicated signal wiring structure.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
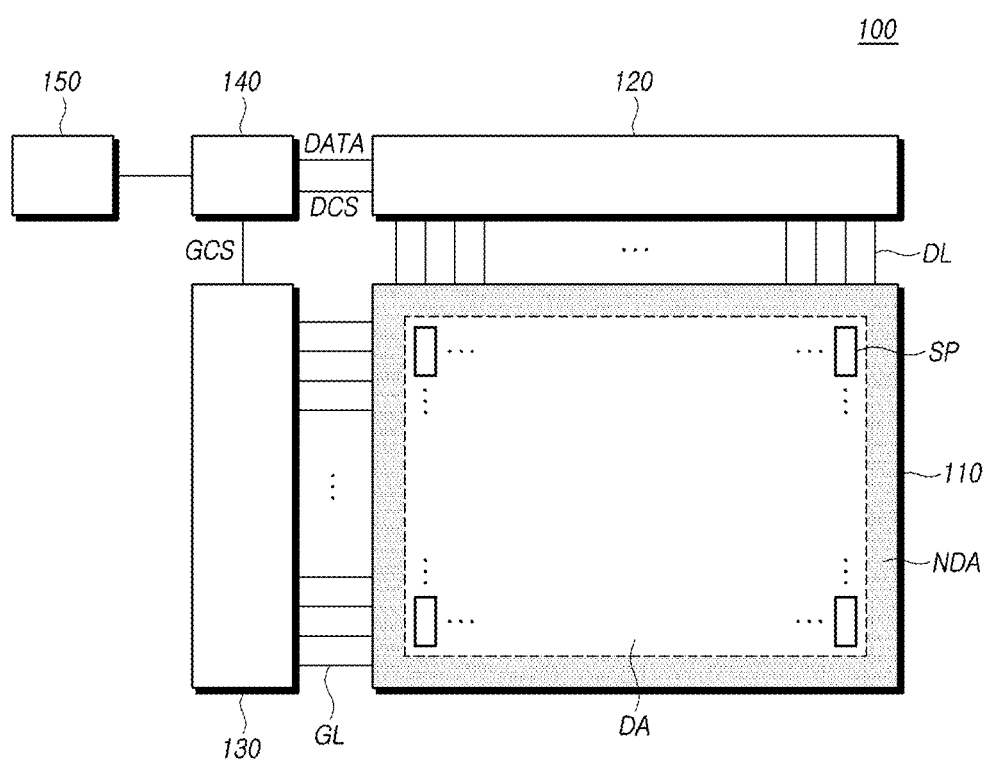
FIG. 1 is a system configuration diagram of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", and "constituting" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

FIG. 1 is a system configuration diagram of a display device 100 according to embodiments of the present disclosure.

Referring to FIG. 1, a display device 100 according to embodiments of the present disclosure may include a display panel 110 and a driving circuit for driving the display panel 110. The driving circuit may include a data driving circuit 120 and a gate driving circuit 130, and the like. The display device 100 according to embodiments of the present disclosure may further include a display controller 140 that controls the data driving circuit 120 and the gate driving circuit 130.

The display panel 110 may include signal lines such as a plurality of data lines DL and a plurality of gate lines GL, and a plurality of subpixels SP to which a plurality of data lines DL and a plurality of gate lines GL are connected.

The display panel 110 may include a display area DA in which an image is displayed and a non-display area NDA in which an image is not displayed.

In the display area DA, signal lines such as the plurality of data lines DL and the plurality of gate lines GL may be disposed, and the plurality of subpixels SP for displaying an image may be disposed. In the non-display area NDA, signal lines disposed in the display area DA may be extended and disposed, the data driving circuit 120 and/or the gate driving circuit 130 may be mounted. In the non-display area NDA, a pad portion to which the data driving circuit 120, the gate driving circuit 130, or a printed circuit is connected may be disposed.

The data driving circuit 120 is a circuit for driving the plurality of data lines DL, and may supply data signals to the plurality of data lines DL.

The gate driving circuit 130 is a circuit for driving the plurality of gate lines GL, and may supply gate signals to the plurality of gate lines GL.

The display controller 140 may supply a data control signal DCS to the data driving circuit 120 in order to control an operation timing of the data driving circuit 120. The display controller 140 may supply a gate control signal GCS for controlling an operation timing of the gate driving circuit 130 to the gate driving circuit 130.

The display controller 140 may supply image data DATA to the data driving circuit 120 based on an image signal input from the host module 150. More specifically, the display controller 140 may start scanning according to the timing implemented in each frame, convert the image signal input from the external host module 150 in accordance with the data signal format used by the data driving circuit 120, and supply image data DATA, which is the converted image signal to the data driving circuit 120. The display controller 140 may control data driving at an appropriate time according to the scan.

The display controller 140 may receive input image data (image signal) and various timing signals from an external device (e.g., the host module 150). Here, the various timing signals may include at least one of VSYNC (Vertical Synchronization Signal), HSYNC (Horizontal Synchronization Signal), DE (Input Data Enable Signal), CLK (Clock signal), and the like.

In order to control the data driving circuit 120 and the gate driving circuit 130, the display controller 140 may receive timing signals such as VSYNC, HSYNC, DE, and CLK, generate various control signals DCS and GCS based on the received timing signals VSYNC, HSYNC, DE, and CLK, and output various generated control signals DCS and GCS to the data driving circuit 120 and the gate driving circuit 130.

For example, the display controller 140 may output various gate control signals GCS including GSP (gate start pulse), GSC (gate shift clock), GOE (gate output enable), and the like to control the gate driving circuit 130.

Here, the GSP controls operation start timing of one or more gate driver integrated circuits constituting each of the gate driving circuits 130. The GSC is a clock signal commonly input to one or more gate driver integrated circuits, and controls shift timing of scan signals (i.e., gate pulses). The GOE specifies timing information for one or more gate driver integrated circuits.

In addition, the display controller 140 may output various data control signals DCS including SSP (source start pulse), SSC (source sampling clock), SOE (source output enable signal) and the like in order to control the data driving circuit 120.

Here, the SSP controls the data sampling start timing of one or more source driver integrated circuits constituting the data driving circuit 120. The SSC is a clock signal that controls the sampling timing of data in each of the source driver integrated circuits. The SOE controls the output timing of the data driving circuit 120.

The display controller 140 may be implemented as a separate component from the data driving circuit 120, or may be integrated with the data driving circuit 120 to be implemented as an integrated circuit.

The data driving circuit 120 drives the plurality of data lines DL by receiving image data DATA from the display controller 140 and supplying data voltages to the plurality of data lines DL. Here, the data driving circuit 120 is also referred to as a source driving circuit.

The data driving circuit 120 may include one or more source driver integrated circuits (SDIC). Each SDIC may include a shift register, a latch circuit, a digital to analog converter (DAC), an output buffer, and the like. Each SDIC may further include an analog to digital converter (ADC) in some cases.

For example, each SDIC may be connected to the pad portion of the display panel 110 in a TAB (Tape Automated Bonding) type, a COG (Chip on Glass) type, a COP (Chip on Panel) type, or a COF (Chip on Film) type.

The gate driving circuit 130 may output a gate signal of a turn-on level voltage or a gate signal of a turn-off level voltage under the control of the display controller 140. The gate driving circuit 130 may sequentially drive the plurality of gate lines GL by sequentially supplying the gate signals of the turn-on level voltage to the plurality of gate lines GL.

The gate driving circuit 130 may be connected to the pad portion of the display panel 110 in a TAB (tape automated bonding) type, a COG (chip on glass) type, a COP (chip on panel) type, or a COF (chip on film) type. Alternatively, the gate driving circuit 130 may be formed in the non-display area NDA of the display panel 110 in a GIP (gate in panel) type.

When the specific gate line GL is turned on by the gate driving circuit 130, the data driving circuit 120 may convert the image data DATA received from the display controller 140 into an analog data voltage, and supply the data voltage converted into an analog form to the plurality of data lines DL.

The data driving circuit 120 may be connected to one side (e.g., upper or lower side) of the display panel 110. Depending on the driving method, the panel design method, etc., the data driving circuit 120 may be connected to both sides of the display panel 110 (e.g., upper and lower side), or to two or more of the four sides of the display panel 110.

The gate driving circuit 130 may be connected to one side (e.g., left or right side) of the display panel 110. Depending on the driving method, the panel design method, etc., the gate driving circuit 130 may be connected to both sides of the display panel 110 (e.g., left and right side), or to two or more of the four sides of the display panel 110.

The display controller 140 may be a timing controller used in a conventional display technology, or a control device capable of further performing other control functions including a timing controller.

The display controller 140 may be implemented with various circuits or electronic components such as an integrated circuit (IC), a field programmable gate array (FPGA), an application specific integrated circuit (ASIC), or a processor.

The display controller 140 may be mounted on a printed circuit board or a flexible printed circuit, and may be electrically connected to the data driving circuit 120 and the gate driving circuit 130 through a printed circuit board or a flexible printed circuit.

The display controller 140 may transmit and receive signals to and from the data driving circuit 120 according to one or more predetermined interfaces. Here, for example, the interfaces may include at least one of a low voltage differential signaling (LVDS) interface, an EPI interface, and a serial peripheral interface (SPI).

The display controller 140 may include one or more storage media such as one or more registers.

The display device 100 according to embodiments of the present disclosure may be a self-luminous display such as an OLED (organic light emitting diode) display, a quantum dot display, and a micro LED (micro light emitting Diode) display.

When the display device 100 is an OLED display, each subpixel SP may include an organic light emitting diode (OLED) that emits light as a light emitting device. When the display device 100 is a quantum dot display, each subpixel SP may include a light emitting device made of a quantum dot, which is a semiconductor crystal that emits light by itself. When the display device 100 is a micro LED display, each subpixel SP may emit light by itself and include a micro LED (micro light emitting diode) made based on an inorganic material as a light emitting device.

Figure 2:
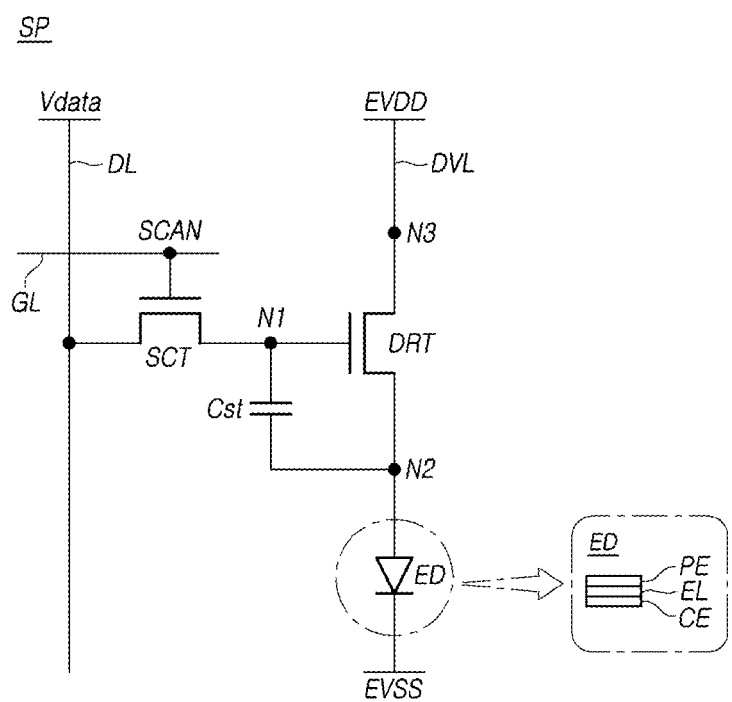
FIG. 2 is an equivalent circuit of a subpixel of the display device according to embodiments of the present disclosure.

FIG. 2 is an equivalent circuit of a subpixel SP of the display device 100 according to embodiments of the present disclosure.

Referring to FIG. 2, each of the plurality of subpixels SP disposed on the display panel 110 of the display device 100 according to the embodiments of the present disclosure may include a light emitting device ED and a driving transistor DRT, a scan transistor SCT, and a storage capacitor Cst. As described above, when the subpixel SP includes two transistors DRT and SCT and one capacitor Cst, the subpixel SP is said to have a 2T (Transistor) 1C (Capacitor) structure.

The light emitting device ED may include an anode electrode and a cathode electrode, and a light emitting layer EL positioned between the anode electrode and the cathode electrode.

Here, the anode electrode may be a pixel electrode PE included in each subpixel SP. The cathode electrode may be a common electrode CE common to all subpixels SP.

For example, the light emitting device ED may be an organic light emitting diode (OLED), a light emitting diode (LED), or a quantum dot light emitting device.

The driving transistor DRT is a transistor for driving the light emitting device ED, and may include a first node N1, a second node N2, a third node N3, and the like.

The first node N1 of the driving transistor DRT may be a gate node of the driving transistor DRT, and may be electrically connected to a source node or a drain node of the scan transistor SCT. The second node N2 of the driving transistor DRT may be a source node or a drain node of the driving transistor DRT, and may be electrically connected to the pixel electrode PE of the light emitting device ED. The third node N3 of the driving transistor DRT may be electrically connected to a driving voltage line DVL supplying a driving voltage EVDD.

The scan transistor SCT may be controlled by a scan signal SCAN and may be connected between the first node N1 of the driving transistor DRT and the data line DL. In other words, the scan transistor SCT may be turned on or off according to the scan signal SCAN supplied from the gate line GL, so that the connection between the data line DL and the first node N1 of the driving transistor DRT may be controlled.

The scan transistor SCT is turned on by the scan signal SCAN having a turn-on level voltage, so that the data voltage Vdata supplied from the data line DL may be transmitted to the first node N1 of the driving transistor DRT.

Each of the driving transistor DRT and the scan transistor SCT may be a n-type transistor or a p-type transistor.

The storage capacitor Cst may be connected between the first node N1 and the second node N2 of the driving transistor DRT. The storage capacitor Cst may charge the amount of charge corresponding to the voltage difference between both ends and maintain the voltage difference between both ends for a predetermined frame time. Accordingly, during a predetermined frame time, the subpixel SP may emit light.

The storage capacitor Cst is not a parasitic capacitor (e.g., Cgs, Cgd), which is an internal capacitor existing between the gate node and the source node (or drain node) of the driving transistor DRT, but an external capacitor intentionally designed outside the driving transistor DRT.

The subpixel SP disposed on the display panel 110 may further include one or more transistors, and in some cases, may further include one or more capacitors.

Meanwhile, in the display panel 110 of the display device 100 according to embodiments of the present disclosure, the driving transistor DRT and/or the light emitting device ED included in each subpixel SP may have unique characteristic values. For example, a characteristic value of the driving transistor DRT may include a threshold voltage and/or mobility. The unique characteristic value of the light emitting device ED may include a threshold voltage or the like.

The characteristic value of the driving transistor DRT included in each of the plurality of subpixels SP may change as the driving time elapses. The driving times of the plurality of subpixels SP may not be all the same. That is, the driving time of some of the subpixels SP among the plurality of subpixels SP may be different from the driving time of the other subpixels SP.

Accordingly, the characteristic values of the driving transistors DRT of each of the plurality of subpixels SP may not be all the same. That is, the characteristic value of the driving transistor DRT of some of the subpixels SP among the plurality of subpixels SP may be different from the characteristic value of the driving transistor DRT of the other subpixel SP.

Due to the deviation in characteristic values between the plurality of driving transistors DRT disposed on the display panel 110, a luminance deviation between the plurality of subpixels SP disposed on the display panel 110 may occur. Accordingly, luminance non-uniformity may occur in the display panel 110.

Similar to the characteristic value deviation between the plurality of driving transistors DRT disposed on the display panel 110, there may also be a characteristic value deviation between the plurality of light emitting devices ED disposed on the display panel 110. Accordingly, a luminance deviation between the plurality of subpixels SP disposed on the display panel 110 may occur, and luminance non-uniformity may occur in the display panel 110.

A conventional display device performs complex sensing driving on the subpixels SP of the display panel 110 and senses signal lines disposed on the display panel 110, thereby senses the characteristic values of the driving transistors DRT or the light emitting devices ED. The conventional display device may provide a compensation function for reducing a characteristic value deviation between the driving transistors DRT or a characteristic value deviation between the light emitting devices ED using a sensing result obtained through complex sensing driving.

That is, in order to provide a compensation technology, a conventional display device must essentially have a complex subpixel structure and a complex signal wiring structure for sensing a luminance deviation between the subpixels SP. In addition, since characteristic values of the subpixels SP are sensed by driving the subpixels SP having a complex structure, the conventional sensing driving method is inevitably complicated.

However, the display device 100 according to embodiments of the present disclosure may have a new movable sensor structure and provide a compensation function using a new movable sensor structure. Accordingly, the display device 100 according to embodiments of the present disclosure can provide a compensation function without having a complex subpixel structure and a complex signal wiring structure, and without performing complex sensing driving.

Hereinafter, various movable sensor structures of the display device 100 according to embodiments of the present disclosure will be described. In addition, a simple sensing operation and compensation process using various movable sensor structures of the display device 100 according to embodiments of the present disclosure will be described.

Figure 3A:
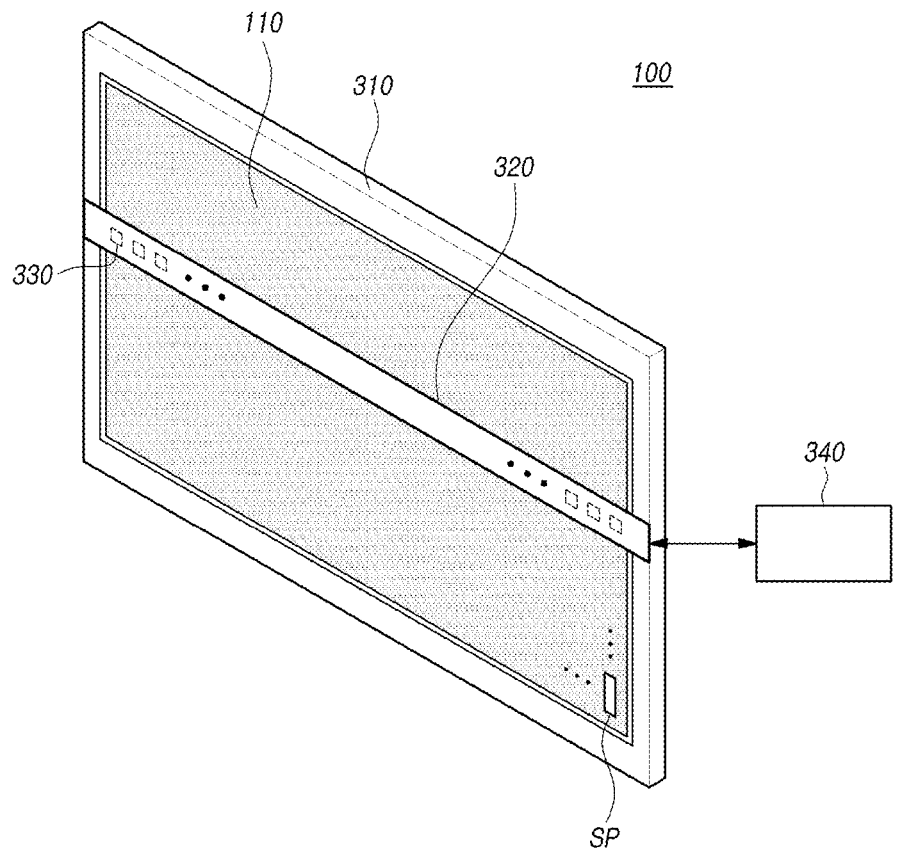
FIGS. 3A, 3B, and 3C are diagrams schematically illustrating the display device having a movable sensor structure according to embodiments of the present disclosure.
Figure 3B:
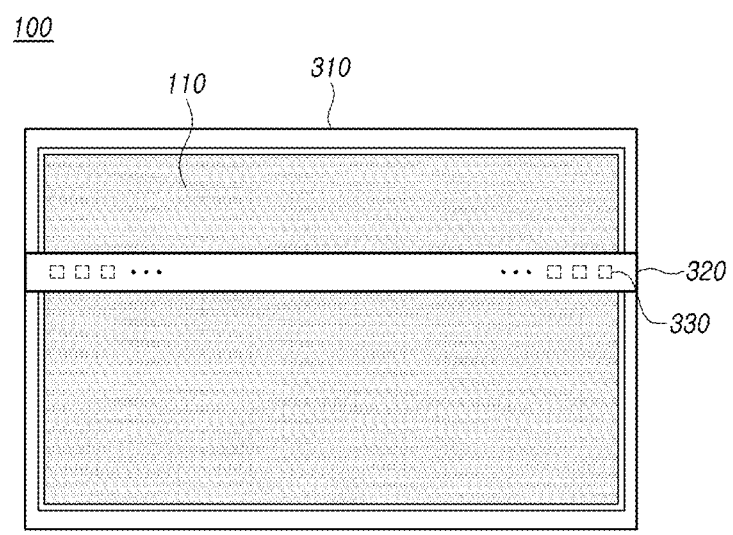
Figure 3C:
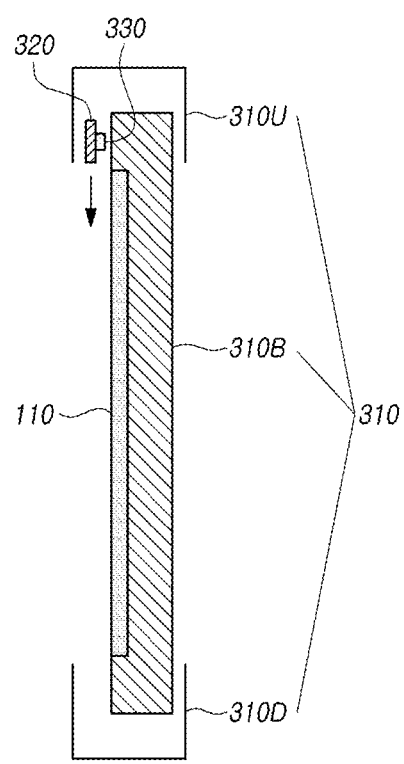

FIGS. 3A, 3B, and 3C are diagrams schematically illustrating the display device 100 having a movable sensor structure according to embodiments of the present disclosure.

Referring to FIGS. 3A, 3B and 3C, a display device 100 according to example embodiments of the present disclosure includes the display panel 110 including the plurality of data lines DL, the plurality of gate lines GL, and the plurality of subpixels SP, and a housing 310 protecting the display panel 110.

Referring to FIGS. 3A, 3B and 3C, the display device 100 according to the embodiments of the present disclosure includes a moving bar 320 and a plurality of sensor modules 330 mounted on the moving bar 320 as a movable sensor structure. That is, the movable sensor structure of the display device 100 according to the embodiments of the present disclosure includes the moving bar 320 and the plurality of sensor modules 330.

The moving bar 320 may be installed to be movable in the housing 310 and may be moved at front of the viewing surface of the display panel 110. The plurality of sensor modules 330 may be mounted on the moving bar 320 to face the viewing surface of the display panel 110.

Referring to FIGS. 3A, 3B and 3C, the display device 100 according to embodiments of the present disclosure may further include a sensing controller 340 capable of performing a control function for a movable sensor structure.

The sensing controller 340 may control movement of the moving bar 320, control operations of the plurality of sensor modules 330, and receive sensing values of each of the plurality of sensor modules 330. The sensing controller 340 may calculate the luminance of the subpixels SP based on the received sensing value. The sensing controller 340 may perform a compensation process for reducing a luminance deviation of the subpixels SP based on the calculated luminance Here, the compensation process may include calculating a compensation value and processing data change. Here, the luminance of the subpixel SP may mean the brightness of light emitted from the light emitting device ED included in the subpixel SP. The sensing value of the sensor module 330 may be a value obtained by sensing the luminance (brightness) of light emitted from the light emitting device ED in the subpixel SP by the sensor module 330.

The sensing controller 340 may recognize a position at which the moving bar 320 is moved and the positions of a plurality of sensor modules 330 mounted on the moving bar 320 according to the control of the moving bar 320.

When the sensing controller 340 recognizes the position of the moving bar 320, the sensing controller 340 may know information on the subpixel SP corresponding to each of the plurality of sensor modules 330 mounted on the moving bar 320 at the recognized position. Here, for example, the information on the subpixel SP may include location information (e.g., row information, column information) of the subpixel SP.

When the sensing controller 340 receives a sensing value from each of the plurality of sensor modules 330 mounted on the moving bar 320 at an arbitrary position where the moving bar 320 has moved, the sensing controller 340 may recognize a subpixel SP corresponding to the received sensing value among the plurality of subpixels SP.

When the image signal is not supplied to the display controller 140, the sensing controller 340 may control the movement of the moving bar 320 and may control the operation of the plurality of sensor modules 330. That is, when the user has turned off the display device 100 or the user does not view an image through the display device 100, the display device 100 may perform sensing and compensation using the movable sensor structure.

Referring to FIG. 3C, for example, the housing 310 may include a back cover 310B covering the rear and side surfaces of the display panel 110. The housing 310 may further include at least one of an upper cover 310U positioned on/over the upper side of the display panel 110 and a lower cover 310D is positioned on/over the lower side of the display panel 110. That is, both the upper cover 310U and the lower cover 310D may exist, or only one of the upper cover 310U or the lower cover 310D may exist.

When the sensing operation is not in progress, the moving bar 320 may be covered by the upper cover 310U or the lower cover 310D so that the moving bar 320 is not visible from the front.

As described above, the display device 100 according to the embodiments of the present disclosure can easily and accurately determine the luminance characteristics of the subpixels SP by using the movable sensor structure.

Therefore, in order to find out the luminance characteristics of the subpixels SP, the display device 100 according to the embodiments of the present disclosure does not perform complex sensing driving for the subpixels SP of the display panel 110 and sensing processing for signal lines of the display panel 110. Here, for example, the luminance characteristics of the subpixels SP may be related to the threshold voltage and mobility of the driving transistor DRT, the threshold voltage of the light emitting device ED, and the like.

Accordingly, the display device 100 according to the embodiments of the present disclosure does not need to include circuit components such as a sample-and-hold circuit and an analog-to-digital converter in order to sense the electrical state of signal lines arranged on the display panel 110.

In addition, since the display device 100 according to the embodiments of the present disclosure does not require complex sensing driving of the subpixels SP, subpixels SP may be formed with a simple structure (e.g., 2T1C in FIG. 2). Accordingly, the aperture ratio of the display panel 110 may be improved, and it may be easier to implement the display panel 110 having a higher resolution. In addition, the manufacturing process of the display panel 110 may be simplified.

Figure 4:
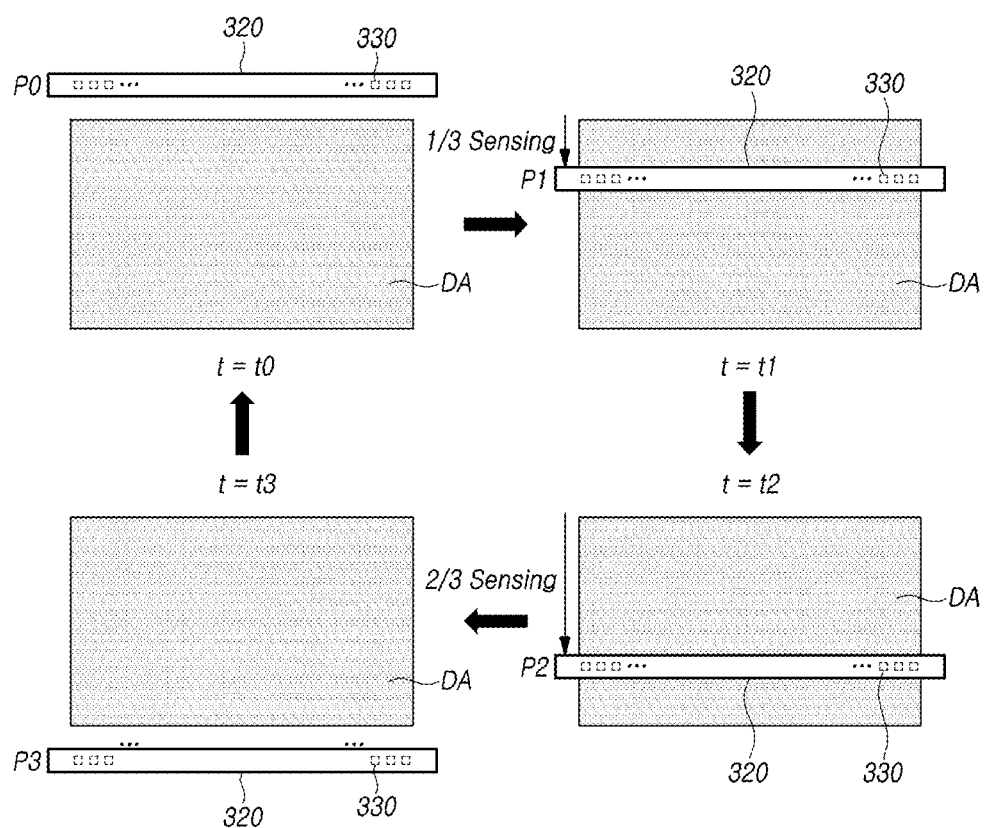
FIG. 4 is a diagram illustrating a movement operation of the movable sensor structure of the display device according to embodiments of the present disclosure.

FIG. 4 is a diagram illustrating a movement operation of the movable sensor structure of the display device 100 according to embodiments of the present disclosure.

Referring to FIG. 4, when the compensation timing starts, the display device 100 according to example embodiments moves the moving bar 320. After the moving bar 320 starts to move, the display device 100 may sense the luminance of a plurality of subpixels SP disposed on the display panel 110 through a plurality of sensor modules 330 mounted on the moving bar 320.

FIG. 4 shows the positions of the moving bar 320 at four time points (t=t0, t1, t2, and t3) in time. The four time points (t=t0, t1, t2, and t3) may be time points in which the user does not view an image through the display device 100.

Referring to FIG. 4, a time point at t=t0 refers to a time point before the start of the compensation timing or before the start of the sensing operation in earnest even after the start of the compensation timing.

Referring to FIG. 4, at a time point t=t0, the moving bar 320 may be positioned at an initial position P0 above the display area DA of the display panel 110. At the time point t=t0, the plurality of sensor modules 330 mounted on the moving bar 320 do not perform a sensing operation. Here, at a time point t=t0, the moving bar 320 may be positioned at an initial position P0 covered by the upper cover 310U so as not to cover the display area DA of the display panel 110.

Referring to FIG. 4, after a time point t=t0, a sensing operation may be started in earnest according to the start of the compensation timing. For the sensing operation, after a point in time t=t0, the moving bar 320 may move downward from an initial position P0 outside the upper end of the display area DA of the display panel 110. As the moving bar 320 moves, when the moving bar 320 is positioned over/on the viewing surface of the display panel 110, the plurality of sensor modules 330 mounted on the moving bar 320 may perform a sensing operation.

Referring to FIG. 4, during t0 to t1, the moving bar 320 moves to a position P1 that is ⅓ of the length in the column direction of the display area DA. That is, at a time point t=t1, the moving bar 320 may be located at a first position P1 separated by ⅓ of the column direction length of the display area DA of the display panel 110 from the initial position P0. At a time point t=t1, the plurality of sensor modules 330 mounted on the moving bar 320 may be in a state in which a sensing operation is performed on an upper area corresponding to ⅓ of the display area DA.

Referring to FIG. 4, at a time point t=t2, the moving bar 320 may be located at a second position P2 separated by ⅔ of the column direction length of the display area DA of the display panel 110 from the initial position P0. At a time point t=t2, the plurality of sensor modules 330 mounted on the moving bar 320 may be in a state in which a sensing operation is performed on an upper area corresponding to ⅔ of the display area DA.

Referring to FIG. 4, during t0 to t3, the moving bar 320 may pass over the entire area of the display area DA. At a time point t=t3, the moving bar 320 may be positioned at a third position P3 located outside the lower end of the display area DA. At a time point t=t3, the plurality of sensor modules 330 mounted on the moving bar 320 have completed sensing operations for all areas of the display area DA.

Referring to FIG. 4, during a period between t=t0 and t=t3, the plurality of sensor modules 330 mounted on the moving bar 320 may acquire sensing values (sensing data) through sensing of the entire area of the display area DA. Thereafter, the plurality of sensor modules 330 mounted on the moving bar 320 may transmit the acquired sensing values (sensing data) to the sensing controller 340.

The sensing controller 340 may calculate the luminance of each of the plurality of subpixels SP disposed on the display panel 110 by using sensing values received from the plurality of sensor modules 330. The sensing controller 340 may compare the luminance calculated for each of the plurality of subpixels SP with a reference luminance, and calculate a luminance change amount for each of the plurality of subpixels SP. The sensing controller 340 may generate compensation values capable of reducing or removing a luminance deviation between the plurality of subpixels SP based on the amount of luminance change calculated for each of the plurality of subpixels SP. The sensing controller 340 may store the generated compensation values in a compensation look-up table (LUT). Here, the compensation value may include an offset and a gain to be used in the image data change processing (compensation processing). The sensing controller 340 may generate changed image data by adding an offset to the original image data and multiplying a value obtained by adding the offset to the original image data by a gain. Here, the compensation values may be aging compensation values of the light emitting devices ED. Alternatively, the compensation values may be compensation values over time of the light emitting devices ED. Alternatively, the compensation values may be values for compensating the deterioration of the light emitting devices ED over time.

The display controller 140 may change the image data with reference to the compensation LUT and supply the changed image data to the data driving circuit 120.

Referring to FIG. 4, after a time point t=t3, the location of the moving bar 320 may be initialized. That is, the moving bar 320 may return to the initial position P0 located outside the upper end of the display area DA of the display panel 110.

Alternatively, after the time point t=t3, the position initialization process in which the moving bar 320 returns to the initial position P0 may not proceed. That is, after the sensing operation is completed, the moving bar 320 may not return to the uppermost position P0 located outside the upper end of the display area DA. Instead, the moving bar 320 may remain at the lowermost position P3 located outside the lower end of the display area DA. In this case, for the next sensing operation, while the moving bar 320 starts at the lowermost position P3 and moves toward the uppermost position P0, the plurality of sensor modules 330 mounted on the moving bar 320 may perform a sensing operation. That is, the initial position of the moving bar 320 immediately before the start of the sensing operation may be the position of the moving bar 320 when the previous sensing operation is completed, and may be the uppermost position P0 or the lowermost position P3.

Referring to FIG. 4, while a sensing operation of the plurality of sensor modules 330 is in progress, that is, while the moving bar 320 is moving, the sensing image may be displayed on the entire area of the display area DA of the display device 100. Here, for example, the sensing image may be an image having a specific gray scale. For example, the sensing image may be a white image.

Alternatively, referring to FIG. 4, while the sensing operation of the plurality of sensor modules 330 is in progress, that is, while the moving bar 320 is moving, the sensing image may be displayed only in an area overlapping the moving bar 320. Accordingly, the sensing image may be displayed only in a partial area of the display area DA of the display panel 110. The display position of the sensing image may be moved according to the movement of the moving bar 320.

In this case, the plurality of sensor modules 330 may perform luminance sensing at a display position of the sensing image. In order not to affect the luminance sensing of the plurality of sensor modules 330, a black image may be displayed in an area in which the sensed image is not displayed in the display area DA.

Figure 5A:
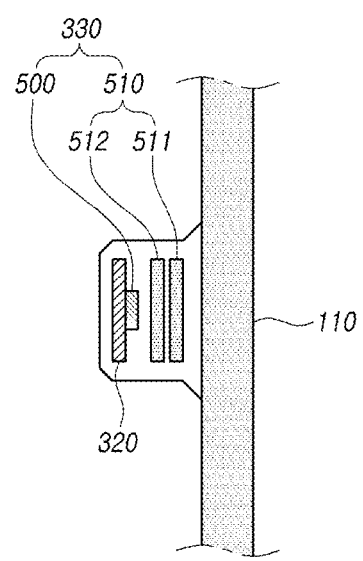
FIG. 5A is an exemplary view of a sensor module included in the movable sensor structure of the display device according to embodiments of the present disclosure.
Figure 5B:
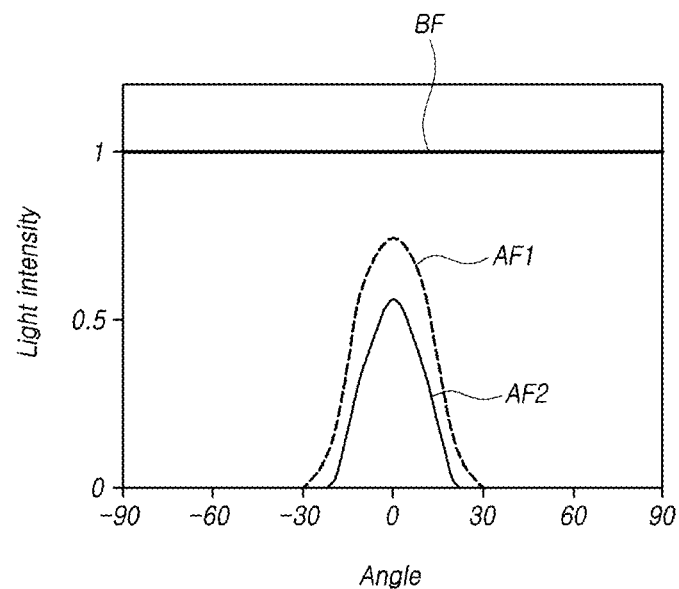
FIG. 5B is a graph showing the light control characteristics of a light control film included in the sensor module of FIG. 5A according to one embodiment.

FIG. 5A is an exemplary view of a sensor module 330 included in the movable sensor structure of the display device 100 according to embodiments of the present disclosure. FIG. 5B is a graph showing the light control characteristics of a light control film 510 included in the sensor module 330 of FIG. 5A according to one embodiment.

Referring to FIG. 5A, each of the plurality of sensor modules 330 may include a luminance sensor 500 and a light controller. The luminance sensor 500 may sense a luminance of a point located on the viewing surface of the display panel 110 according to the movement of the moving bar 320. The light controller may be located between the display panel 110 and the luminance sensor 500. Light emitted from the display panel 110 may be incident on the light controller, so that light within a predetermined angle from the vertical direction (normal direction from viewing surface) of the display panel 110 may be output from the light controller.

Referring to FIG. 5A, the light controller may include a light control film 510. The light control film 510 of the light controller may include at least one of a first light control film 511 that filters light in a first direction and a second light control film 512 that filters light in a second direction crossing the first direction. Here, for example, the first direction may be a horizontal direction and the second direction may be a vertical direction. For another example, the first direction may be a vertical direction and the second direction may be a horizontal direction.

The luminance sensor 500 included in each of the plurality of sensor modules 330 may be an image sensor. For example, the luminance sensor 500 may be implemented as a contact image sensor (CIS).

The light control film 510 may be positioned between the display panel 110 and the luminance sensor 500. The light control film 510 may control light emitted from the display panel 110 and input it to the luminance sensor 500. The light control film 510 may transmit light having high straightness to the luminance sensor 500. Accordingly, the luminance sensor 500 may more accurately sense the luminance of the subpixel SP.

FIG. 5B is a graph showing the intensity of light according to angles for each of light BF emitted from the display panel 110, light AF1 passing through the first light control film 511, and light AF2 passing through the second light control film 512. Here, the angle may mean an angle formed by light and a vertical line of the viewing surface of the display panel 110.

Light BF emitted from the display panel 110 is input to the sensor module 330 at all angles. The light BF emitted from the display panel 110 passes through the first light control film 511 in the sensor module 330. For example, the light AF1 passing through the first light control film 511 may have only a component within an angle of approximately ±30 degrees in the first direction.

The light AF1 passing through the first light control film 511 passes through the second light control film 512 in the sensor module 330. For example, the light AF2 passing through the second light control film 512 may have only a component within an angle of approximately ±20 degrees in the second direction.

When the light BF emitted from the display panel 110 passes through the first light control film 511 and the second light control film 512, straightness increases. Accordingly, the luminance sensor 500 may more accurately sense the luminance of the subpixel SP.

Figure 6A:
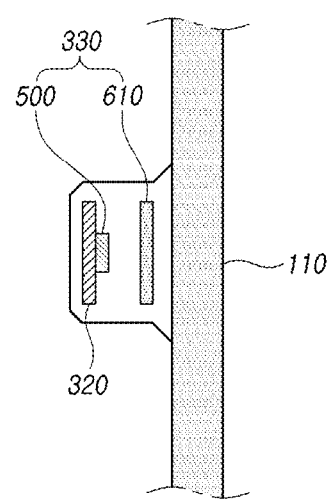
FIG. 6A is another exemplary view of the sensor module included in the movable sensor structure of the display device according to embodiments of the present disclosure.
Figure 6B:
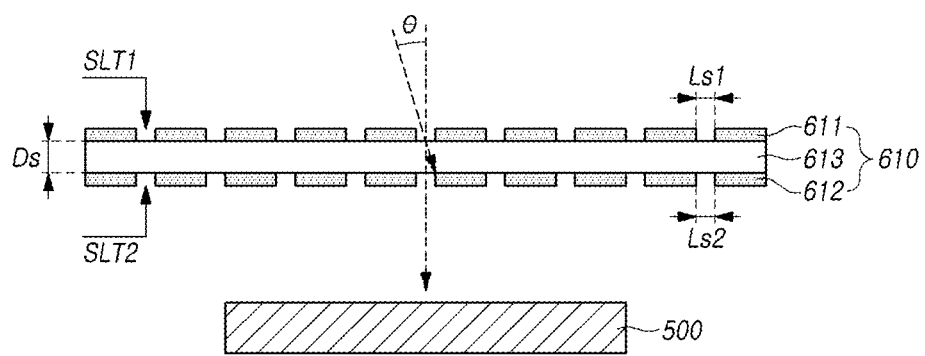
FIG. 6B is a diagram illustrating an optical filter included in the sensor module of FIG. 6A according to one embodiment.

FIG. 6A is another exemplary view of the sensor module 330 included in the movable sensor structure of the display device 100 according to embodiments of the present disclosure. FIG. 6B is a diagram illustrating an optical filter 610 included in the sensor module 330 of FIG. 6A according to one embodiment.

Referring to FIG. 6A, each of the plurality of sensor modules 330 may include a luminance sensor 500 and a light controller. The luminance sensor 500 may sense a luminance of a point located on the viewing surface of the display panel 110 according to the movement of the moving bar 320. The light controller may be located between the display panel 110 and the luminance sensor 500. Light emitted from the display panel 110 may be incident on the light controller, so that light within a predetermined angle from the vertical direction (normal direction from viewing surface) of the display panel 110 may be output from the light controller.

Referring to FIG. 6B, the light controller may include an optical filter 610 including a transmissive layer 613 and a non-transmissive layer 611, 612.

Referring to FIG. 6B, the non-transmissive layer of the optical filter 610 may include one or more of a front non-transmissive layer 611 and a rear non-transmissive layer 612. The front non-transmissive layer 611 may include a plurality of first slits SLT1 positioned on the front surface of the transmission layer 613 and spaced apart from each other by a predetermined first slit interval Ls1. The rear non-transmissive layer 612 may include a plurality of second slits SLT2 positioned on the rear surface of the transmission layer 613 and spaced apart from each other by a predetermined second slit interval Ls2. The first slit interval Ls1 and the second slit interval Ls2 may be the same or different.

The plurality of first slits SLT1 and the plurality of second slits SLT2 may be formed in a direction crossing each other. For example, each of the plurality of first slits SLT1 may be formed in a horizontal direction, and each of the plurality of second slits SLT2 may be formed in a vertical direction. Alternatively, each of the plurality of second slits SLT2 may be formed in a horizontal direction, and each of the plurality of first slits SLT1 may be formed in a vertical direction.

The optical filter 610 may be positioned between the display panel 110 and the luminance sensor 500. The optical filter 610 may be a slit filter that filters only light having high straightness from the light emitted from the display panel 110 and inputs it to the luminance sensor 500. That is, the optical filter 610 may transmit light having high straightness to the luminance sensor 500. Accordingly, the luminance sensor 500 may more accurately sense the luminance of the subpixel SP.

Referring to FIG. 6B, the tangent value of the angle $\theta$ formed by the light and the vertical line of the viewing surface of the display panel 110 is a value obtained by dividing the slit interval Ls by the thickness Ds of the transmission layer 613 (Tan $\theta$=Ls/Ds). The first slit interval Ls1 and the second slit interval Ls2 may be the same as the slit interval Ls in the above angle equation (Tan $\theta$=Ls/Ds, Ls=Ls1=Ls2). If the first slit interval Ls1 and the second slit interval Ls2 are different, the minimum value of the first slit interval Ls1 and the second slit interval Ls2 is selected as the slit interval Ls, and the selected slit interval Ls can be applied to the above angle equation (Tan $\theta$=Ls/Ds).

Referring to FIG. 6B, the angle $\theta$ between the vertical line with respect to the viewing surface of the display panel 110 and the light must have a value within a preset angle (±$\theta$th, for example, $\theta$th=30 degrees) so that the light travels straight for the sensing accuracy of the sensor module 330. Therefore, so that the value Ls/Ds obtained by dividing the slit interval Ls by the thickness Ds of the transmission layer 613 may have a value in the range of tan (+$\theta$th) to tan (−$\theta$th), the slit interval Ls and the thickness Ds of the transmission layer 613 should be designed.

Figure 7A:
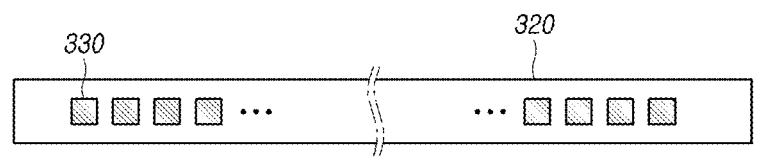
FIGS. 7A, 7B, and 7C are examples of mounting a plurality of sensor modules on a moving bar in the display device according to embodiments of the present disclosure.
Figure 7B:
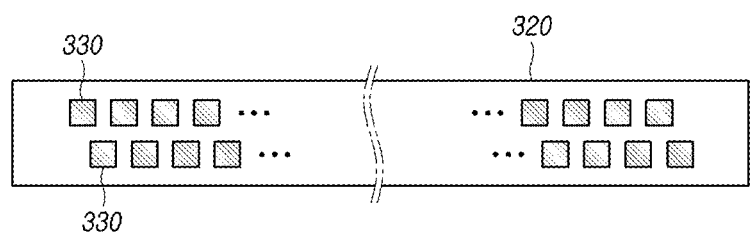
Figure 7C:
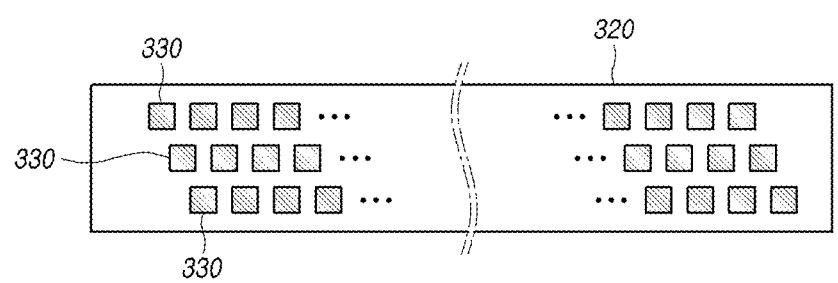

FIGS. 7A, 7B, and 7C are examples of mounting a plurality of sensor modules 330 on a moving bar 320 in the display device 100 according to embodiments of the present disclosure.

Referring to FIG. 7A, the plurality of sensor modules 330 may be arranged in one row and mounted on the moving bar 320.

Referring to FIGS. 7B and 7C, the plurality of sensor modules 330 may be arranged in two or more rows and mounted on the moving bar 320.

When the plurality of sensor modules 330 are arranged in two or more rows on the moving bar 320, compared to the case where the plurality of sensor modules 330 are arranged in one row on the moving bar 320, more sensor modules 330 may be mounted on the moving bar 320.

Accordingly, when the moving bar 320 is in a specific position, there is an advantage of being able to simultaneously sense the luminance of more subpixels SP. However, when the plurality of sensor modules 330 are arranged in two or more rows on the moving bar 320, the number of sensor modules 330 mounted on the moving bar 320 may increase. Accordingly, the weight of the moving bar 320 may become heavier, and more power may be required to move the moving bar 320. Therefore, a motor that enables the movement of the heavy moving bar 320 must be provided (see FIGS. 11 to 17).

When the plurality of sensor modules 330 are arranged in two or more rows, the first sensor module 330 of each of the two or more rows may be aligned in a vertical linear direction, but may be aligned in a diagonal direction as shown in FIGS. 7B and 7C.

Figure 8:
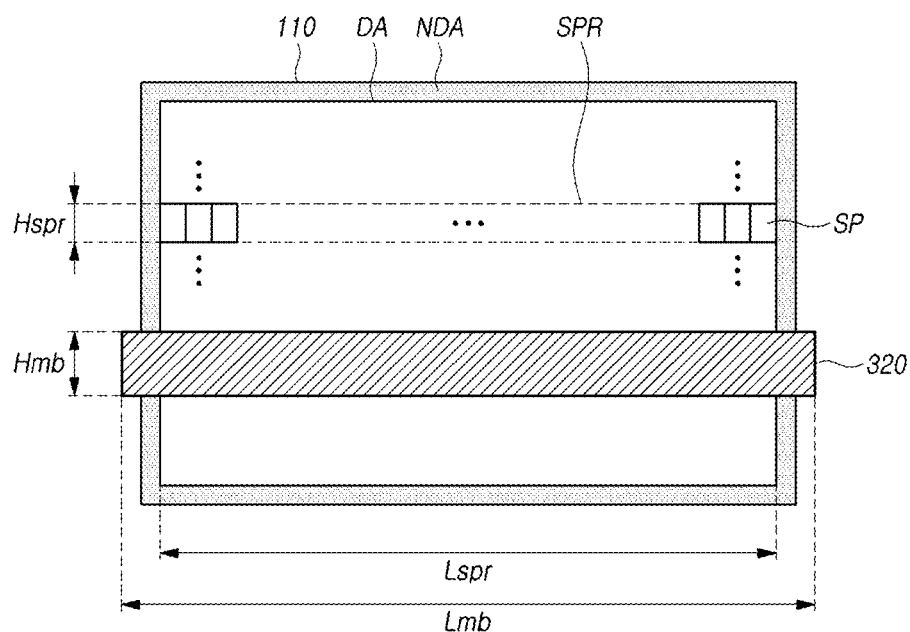
FIG. 8 is a diagram illustrating a size of the moving bar in the display device according to embodiments of the present disclosure.
Figure 9A:
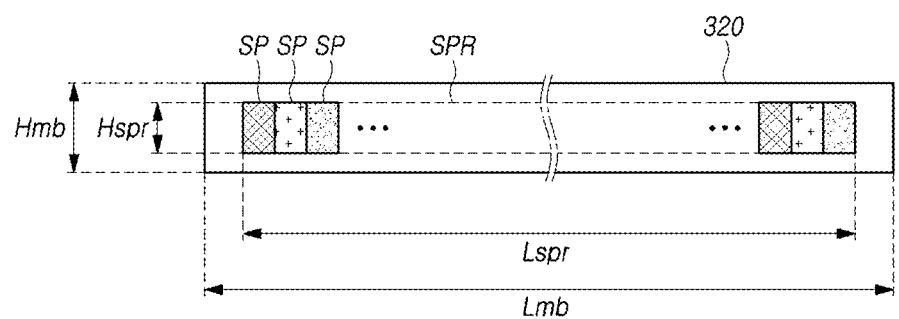
FIG. 9A is a diagram illustrating the moving bar that can overlap one subpixel row in the display device according to embodiments of the present disclosure.
Figure 9B:
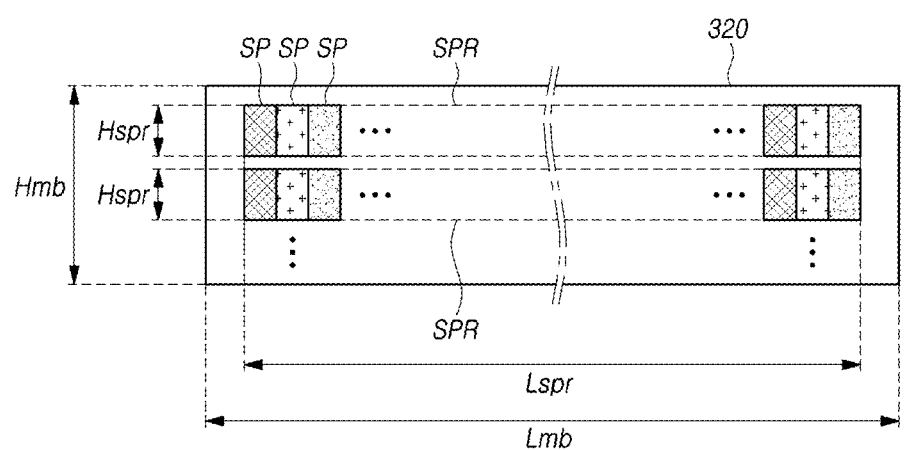
FIG. 9B is a diagram illustrating the moving bar that can overlap two or more subpixel rows in the display device according to embodiments of the present disclosure.

FIG. 8 is a diagram illustrating a size of the moving bar 320 in the display device 100 according to embodiments of the present disclosure. FIG. 9A is a diagram illustrating the moving bar 320 that can overlap one subpixel row SPR in the display device 100 according to embodiments of the present disclosure. FIG. 9B is a diagram illustrating the moving bar 320 that can overlap two or more subpixel rows SPR in the display device 100 according to embodiments of the present disclosure.

Referring to FIG. 8, a plurality of subpixels SP may constitute a plurality of subpixel rows SPR. The moving bar 320 may have a size (area) that may overlap one or more subpixel rows SPR. Accordingly, the horizontal length Lmb of the moving bar 320 may be equal to or greater than the row direction length Lspr of one subpixel row SPR. The vertical length Hmb of the moving bar 320 may be equal to or greater than the column direction length Hspr of one subpixel row SPR. Alternatively, the vertical length Hmb of the moving bar 320 may be equal to or greater than the sum of the column direction length Hspr of each of the two or more subpixel rows SPR. That is, the vertical length Hmb of the moving bar 320 may be equal to or greater than the entire column direction length of two or more subpixel rows SPR.

Referring to FIG. 9A, in the display device 100 according to embodiments of the present disclosure, the moving bar 320 may overlap one subpixel row SPR. In this case, the horizontal length Lmb of the moving bar 320 may be equal to or greater than the row direction length Lspr of one subpixel row SPR, the vertical length Hmb of the moving bar 320 may be equal to or greater than the column direction length Hspr of one subpixel row SPR.

Referring to FIG. 9B, in the display device 100 according to embodiments of the present disclosure, the moving bar 320 may overlap two or more subpixel rows SPR. In this case, the horizontal length Lmb of the moving bar 320 is equal to or greater than the row direction length Lspr of one subpixel row SPR, the vertical length Hmb of the moving bar 320 may be equal to or greater than the sum of the column direction lengths Hspr of the two or more subpixel rows SPR.

As shown in FIG. 9A, when the moving bar 320 may overlap one subpixel row SPR, when the moving bar 320 is positioned at one point, the luminance for a smaller number of subpixels SP may be sensed. Accordingly, a data processing burden may be reduced so that the amount of sensing data transmitted or processed at the same time may be reduced.

As shown in FIG. 9B, when the moving bar 320 may overlap two or more subpixel rows SPR, when the moving bar 320 is positioned at one point, the luminance of more subpixels SP may be sensed. Accordingly, there is an advantage in that the sensing speed and the compensation processing speed are increased.

Figure 10A:
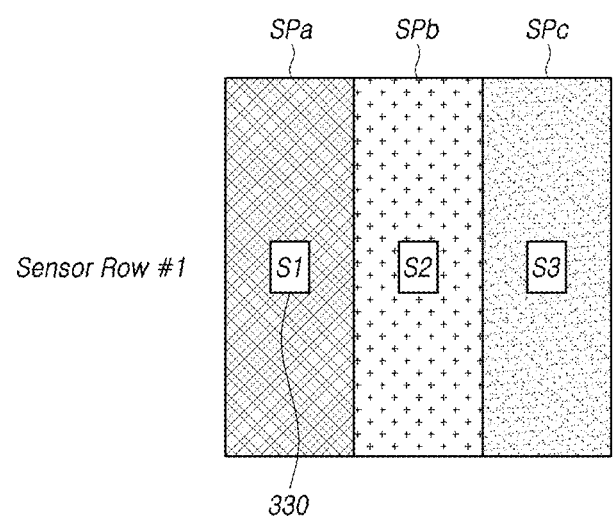
FIG. 10A is a diagram illustrating a structure in which one sensor module and one subpixel are overlapped in the display device according to embodiments of the present disclosure.
Figure 10B:
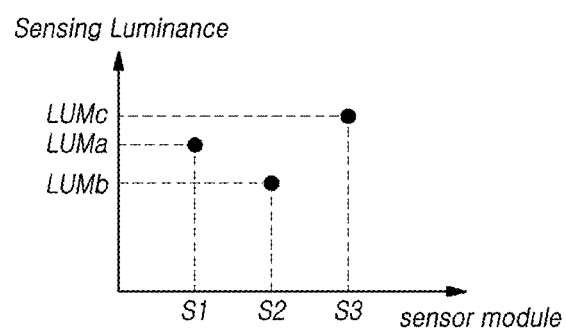
FIG. 10B is a diagram for explaining a method of determining the luminance of each subpixel in the structure of FIG. 10A according to one embodiment.

FIG. 10A is a diagram illustrating a structure in which one sensor module 330 and one subpixel SP are overlapped in the display device 100 according to embodiments of the present disclosure. FIG. 10B is a diagram for explaining a method of determining the luminance of each subpixel SP in the structure of FIG. 10A.

Referring to FIG. 10A, one subpixel SP may overlap one sensor module 330 at any one time point during a period in which the moving bar 320 moves. In this case, the luminance of one subpixel SP may be sensed by one sensor module 330 at any one time point during a period in which the moving bar 320 moves.

The sensing controller 340 may know in advance the position where the moving bar 320 is moved and the positions of the plurality of sensor modules 330 mounted on the moving bar 320. The sensing controller 340 may know in advance information on the subpixel SP corresponding to each of the plurality of sensor modules 330.

In any position where the moving bar 320 has moved, when the sensing controller 340 receives a sensing value from each of the plurality of sensor modules 330 mounted on the moving bar 320, the sensing controller 340 may know which subpixel SP corresponds to the received sensing value based on known information.

For example, referring to FIGS. 10A and 10B, at an arbitrary position where the moving bar 320 has moved, three sensor modules S1, S2, and S3 among the plurality of sensor modules 330 mounted on the moving bar 320 may be positioned to correspond to the three subpixels SPa, SPb, and SPc, respectively. The three sensor modules S1, S2, and S3 may sense the luminance of light emitted from the three subpixels SPa, SPb, and SPc, respectively.

For example, referring to FIGS. 10A and 10B, at an arbitrary position where the moving bar 320 has moved, three sensor modules S1, S2, and S3 transmit a sensing value each sensed for the luminance of light emitted from the three subpixels SPa, SPb, and SPc. The sensing controller 340 calculates the sensing luminance LUMa, LUMb, and LUMc of the three subpixels SPa, SPb, and SPc based on the sensing values received from the three sensor modules S1, S2, and S3.

Figure 10C:
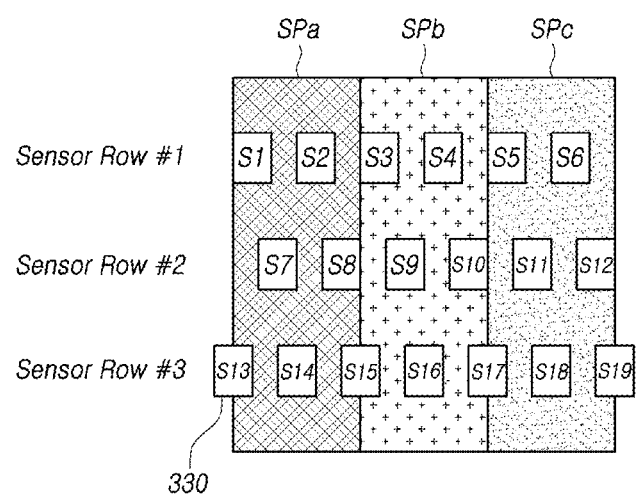
FIG. 10C is a diagram illustrating a structure in which a plurality of sensor modules and one subpixel are overlapped in the display device according to embodiments of the present disclosure.
Figure 10D:
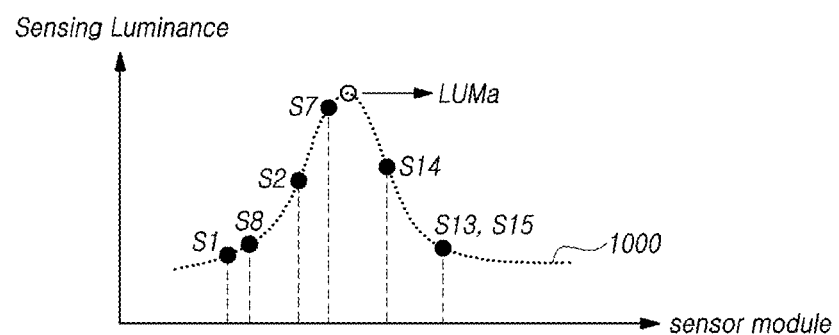
FIG. 10D is a diagram for explaining a method of determining the luminance of each subpixel in the structure of FIG. 10C according to one embodiment.

FIG. 10C is a diagram illustrating a structure in which a plurality of sensor modules 330 and one subpixel SP are overlapped in the display device 100 according to embodiments of the present disclosure. FIG. 10D is a diagram for explaining a method of determining the luminance of each subpixel SP in the structure of FIG. 10C.

Referring to FIG. 10C, at any one time point in the period in which the moving bar 320 moves, one subpixel SP may overlap two or more sensor modules 330. In this case, the luminance of one subpixel SP may be sensed by two or more sensor modules 330 at any one time point in the period during which the moving bar 320 moves.

For example, referring to FIGS. 10C and 10D, the plurality of sensor modules 330 mounted on the moving bar 320 may include 19 or more sensor modules S1 to S19 arranged in three Sensor Rows #1, #2, and #3. Each of the three subpixels SPa, SPb, and SPc may be positioned to overlap with two or more sensor modules 330 among 19 or more sensor modules S1 to S19.

For example, referring to FIGS. 10C and 10D, at an arbitrary position where the moving bar 320 has moved, the positional relationship between the 19 or more sensor modules S1 to S19 included in the plurality of sensor modules 330 mounted on the moving bar 320 and the three subpixels SPa, SPb, and SPc are as follows.

For example, the first subpixel SPa may overlap with the seven sensor modules S1, S2, S7, S8, S13, S14, and S15. The second subpixel SPb may overlap with the seven sensor modules S3, S4, S9, S10, S15, S16, and S17. The third subpixel SPc may overlap with the seven sensor modules S5, S6, S11, S12, S17, S18, and S19.

Referring to FIGS. 10C and 10D, each of the 19 or more sensor modules S1 to S19 may receive light emitted from the overlapping subpixels among the three subpixels SPa, SPb, and SPc during the first time period. In addition, during the first time period or the second time period (a time period different from the first time period), each of the 19 or more sensor modules S1 to S19 may receive light emitted from adjacent subpixels without overlapping with itself among the three subpixels SPa, SPb, and SPc.

For example, the sensor module S2 may receive light emitted from the first subpixel SPa during the first time period, and may also receive light emitted from the second subpixel SPb during the first time period. Alternatively, the sensor module S2 may receive light emitted from the first subpixel SPa during the first time period, and may also receive light emitted from the second subpixel SPb during a second time period different from the first time period.

For example, referring to FIGS. 10C and 10D, among the 19 or more sensor modules S1 to S19, 7 or more sensor modules (S1, S2, S7, S8, S13, S14, S15, . . . ) may receive the light emitted from the first subpixel (SPa), and sense the intensity of the received light.

Referring to FIG. 10D, the sensing controller 340 may determine the distribution of sensing values of seven or more sensor modules S1, S2, S7, S8, S13, S14, S15, . . . in consideration of the sensor module position and the subpixel position. As shown in FIG. 10D, the distribution of the sensed values determined in this way may be modeled as a curve 1000 connecting points representing the sensing luminance (sensed light intensity) for each sensor module location. Here, the sensor module position may be a position from the center of the first subpixel SPa.

Referring to FIG. 10D, the sensing controller 340 may determine the maximum luminance from the modeled curve 1000 as the luminance LUMa of the first subpixel SPa.

Meanwhile, while the moving bar 320 is moving, the plurality of sensor modules 330 may sense the luminance of light emitted to the display panel 110. The sensing points of the plurality of sensor modules 330 may correspond to the emission areas of the subpixels SP. Alternatively, the sensing points of the plurality of sensor modules 330 may correspond to a non-emission area (e.g., area where a black matrix, a bank, etc. are placed) different from the emission area of the subpixels SP.

For example, at a first time point (t=t1 in FIG. 4), the moving bar 320 may overlap the first area of the display panel 110. At a second time point (t=t2 in FIG. 4) after the first time point (t=t1 in FIG. 4), the moving bar 320 may overlap a second area different from the first area in the display panel 110. At the first time point, among the plurality of sensor modules 330 mounted on the moving bar 320, the first sensor module may sense the luminance of light emitted from the n first subpixels SP located in the first area of the display panel 110. Here, n may be a natural number of 1 or more. At the second time point, among the plurality of sensor modules 330 mounted on the moving bar 320, the first sensor module may sense the luminance of light emitted from the m second subpixels SP located in the second area of the display panel 110. Here, m may be a natural number of 1 or more.

The first sensor module may be positioned to correspond to the emission area of the subpixel SP at a first time point, and may be positioned to correspond to the emission area of the subpixels SP at a second time point. In this case, n and m may be the same. The first sensor module may be positioned to correspond to the emission area (or non-emission area) of the subpixels SP at a first time point, and may be positioned to correspond to the non-emission area (or emission area) of the subpixel SP at a second time point. In this case, n and m may be different.

When the sensing point of the sensor module 330 corresponds to a non-emission area different from the emission area of the subpixels SP (e.g., area where a black matrix, a bank, etc. are placed), the sensing value (sensing luminance) sensed by the sensor module 330 may do not accurately reflect the luminance of the subpixels SP.

Accordingly, the sensing controller 340 may discard a sensing value less than a certain threshold among a plurality of sensing values for one subpixel SP received from the two or more sensor modules 330, and may accurately calculate the luminance of one subpixel SP by using only a sensing value equal to or greater than a predetermined threshold value.

In addition, during the sensing operation, the moving bar 320 may repeatedly move across the entire area of the display panel 110 two or more times, accordingly, the plurality of sensor modules 330 mounted on the moving bar 320 may repeatedly sense the entire area of the display panel 110 two or more times. Through this, the sensing controller 340 may obtain a more accurate sensing value.

Meanwhile, the display device 100 according to embodiments of the present disclosure may further include a moving actuator device that enables the moving bar 320 to move up and down in front of the viewing surface of the display panel 110.

In the following, some embodiments of a moving actuator device that activates the movement of the moving bar 320 will be described.

Figure 11:
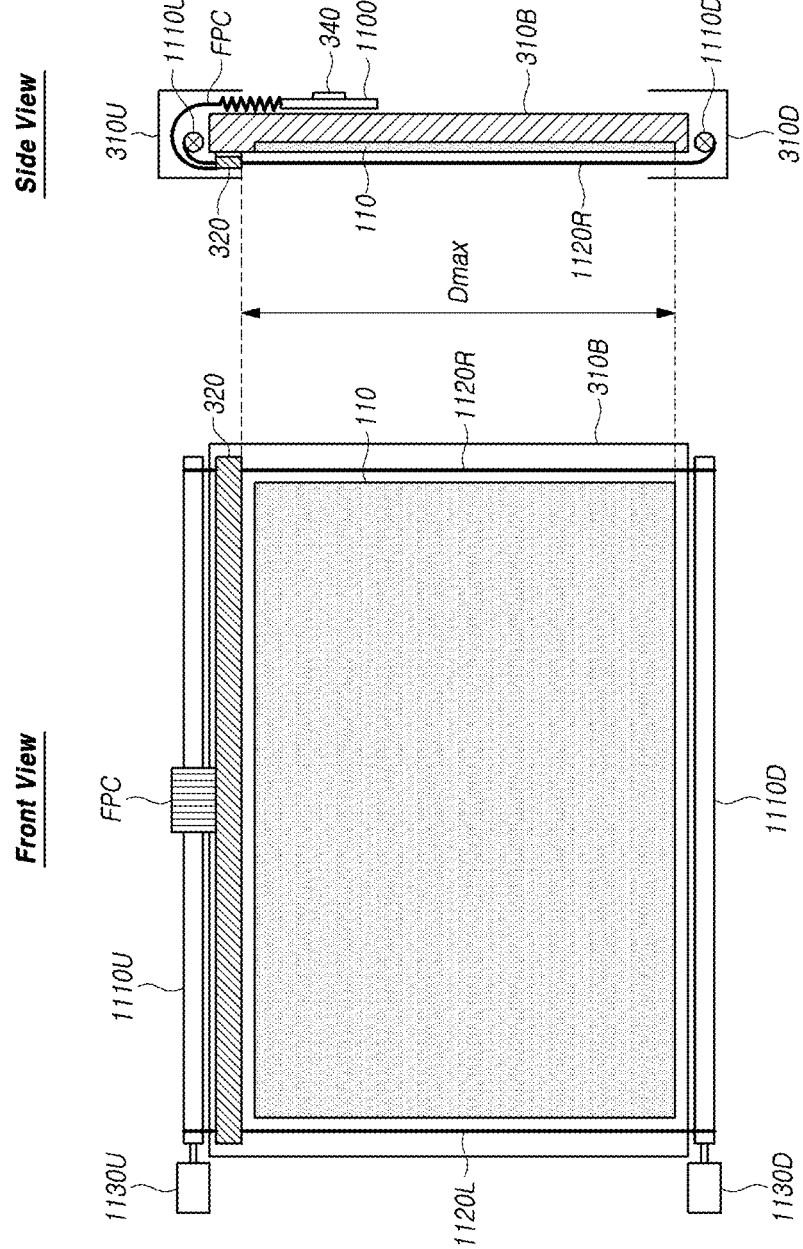
FIGS. 11 and 12 are diagrams illustrating a first movement actuator device for moving the moving bar and an operation thereof in the display device according to embodiments of the present disclosure.
Figure 12:
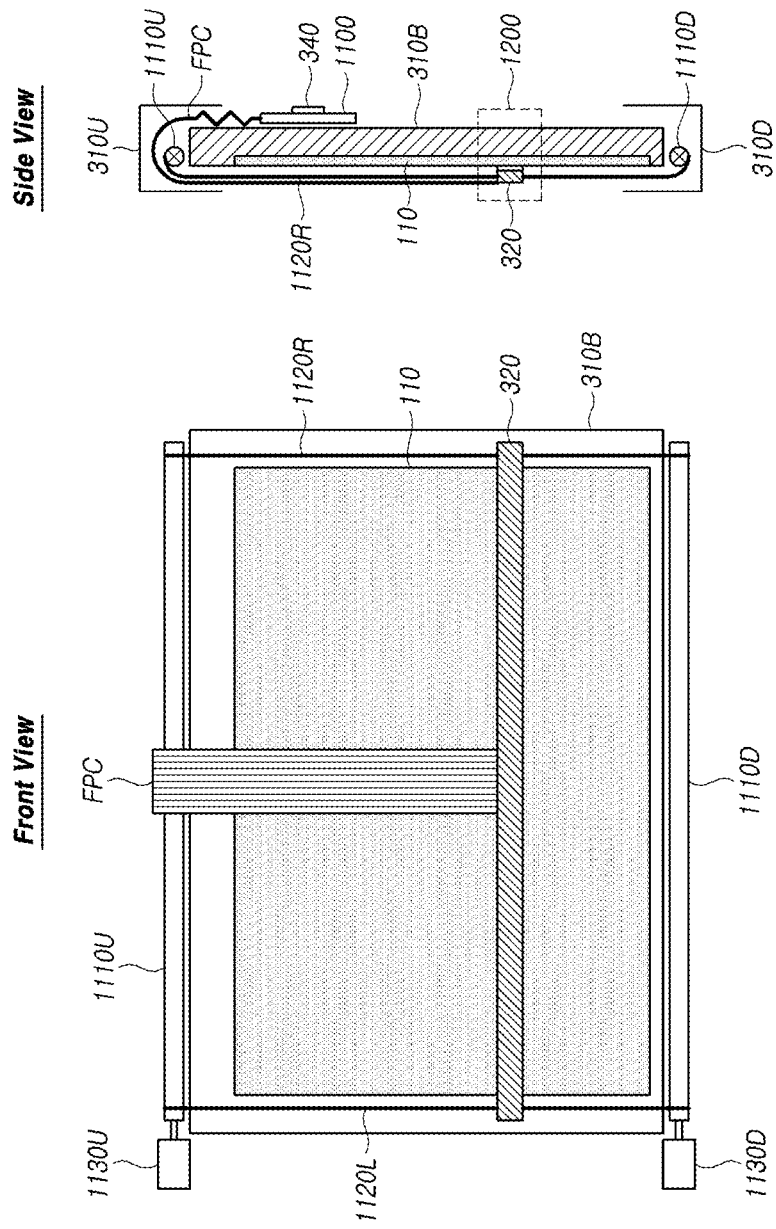

FIGS. 11 and 12 are diagrams illustrating a first movement actuator device for moving the moving bar 320 and an operation thereof in the display device 100 according to embodiments of the present disclosure. FIG. 11 is a view showing a front view and a side view when the moving bar 320 is located at the initial position P0, and FIG. 12 is a diagram illustrating a front view and a side view when the moving bar 320 is moved.

With reference to FIGS. 11 and 12, in the display device 100 according to the embodiments of the present disclosure, the first moving actuator device for moving the moving bar 320 may include a first shaft 1110U, a second shaft 1110D, a first wire 1120L, a second wire 1120R, a first motor 1130U, and a second motor 1130D.

The first shaft 1110U may be installed on an upper side of the display panel 110, and may be located inside the upper cover 310U of the housing 310. The first shaft 1110U may be installed to be rotatable.

The second shaft 1110D may be installed on a lower side of the display panel 110, and may be located inside the lower cover 310D of the housing 310. The second shaft 1110D may be installed to be rotatable.

The first wire 1120L may include a first end coupled to the left side of the first shaft 1110U and a second end coupled to the left side of the second shaft 1110D. Accordingly, the first wire 1120L may interlock (link) the first shaft 1110U and the second shaft 1110D.

The second wire 1120R may include a first end coupled to the right side of the first shaft 1110U and a second end coupled to the right side of the second shaft 1110D. Accordingly, the second wire 1120R may interlock the first shaft 1110U and the second shaft 1110D.

The first wire 1120L and the second wire 1120R may be exposed to the outside. Alternatively, the first wire 1120L and the second wire 1120R may be covered by a cover.

The first motor 1130U may rotate the first shaft 1110U. The first motor 1130U may be installed inside the upper cover 310U of the housing 310.

The second motor 1130D may rotate the second shaft 1110D. The second motor 1130D may be installed inside the lower cover 310D of the housing 310.

The left side of the moving bar 320 may be coupled to the first wire 1120L. The right side of the moving bar 320 may be coupled to the second wire 1120R. Accordingly, when the first wire 1120L and the second wire 1120R move, the moving bar 320 also moves. For example, when the first wire 1120L and the second wire 1120R are wound around the first shaft 1110U, the moving bar 320 moves up. When the first wire 1120L and the second wire 1120R are wound around the second shaft 1110D, the moving bar 320 moves down.

Referring to FIGS. 11 and 12, as the second shaft 1110D rotates by the second motor 1130D to perform the sensing operation, the first wire 1120L and the second wire 1120R may be wound around the second shaft 1110D and the moving bar 320 may descend.

Referring to FIGS. 11 and 12, after the sensing operation is completed, the display device 100 returns to the state of FIG. 11. To this end, so that the moving bar 320 returns to the initial position, the first shaft 1110U rotates by the first motor 1130U, the first wire 1120L and the second wire 1120R are wound around the first shaft 1110U, and the moving bar 320 may rise.

Referring to FIGS. 11 and 12, the display device 100 according to embodiments of the present disclosure may further include a printed circuit board 1100 and a flexible cable. The printed circuit board 1100 may be coupled to the housing 310, for example, to the back cover 310B of the housing 310. A sensing controller 340 may be mounted on the printed circuit board 1100. The flexible cable may be connected to the printed circuit board 1100 and the moving bar 320.

For example, the flexible cable may be a flexible printed circuit (FPC) or a flexible flat cable (FFC). However, in FIGS. 11 and 12, as an example, the flexible cable is shown as a flexible printed circuit (FPC).

In FIGS. 11 and 12, one flexible cable such as a flexible printed circuit (FPC) and a flexible flat cable (FFC) is shown, but this is only an example for convenience of explanation, and two or more flexible cables may be connected between the moving bar 320 and the printed circuit board 1100. For example, when two flexible cables are connected between the moving bar 320 and the printed circuit board 1100, one of the two flexible cables may be disposed adjacent to the first wire 1120L and the other one may be disposed adjacent to the second wire 1120R.

Referring to FIGS. 11 and 12, a length of the flexible cable may be greater than or equal to the maximum moving distance Dmax of the moving bar 320. Accordingly, while the moving bar 320 is moving, the flexible cable may maintain the connection between the moving bar 320 and the printed circuit board 1100.

Meanwhile, while the moving bar 320 is moving, in order for each of the plurality of sensor modules 330 mounted on the moving bar 320 to accurately sense the luminance of the subpixel SP, the gap (distance) between the moving bar 320 and the viewing surface of the display panel 110 need to be kept constant.

That is, while the moving bar 320 is moving, in order for each of the plurality of sensor modules 330 mounted on the moving bar 320 to accurately sense the luminance of the subpixel SP, the gap between the plurality of sensor modules 330 mounted on the moving bar 320 and the viewing surface of the display panel 110 need to be kept constant.

However, in the first moving actuator device of FIGS. 11 and 12, since the moving bar 320 moves along the first wire 1120L and the second wire 1120R, it is difficult to maintain a constant gap between the moving bar 320 and the viewing surface of the display panel 110. That is, it is difficult to maintain a constant gap between the plurality of sensor modules 330 mounted on the moving bar 320 and the viewing surface of the display panel 110.

Accordingly, the first moving actuator device of the display device 100 according to embodiments of the present disclosure may further include a gap maintaining device that maintains a constant gap between the moving bar 320 and the viewing surface of the display panel 110.

Figure 13:
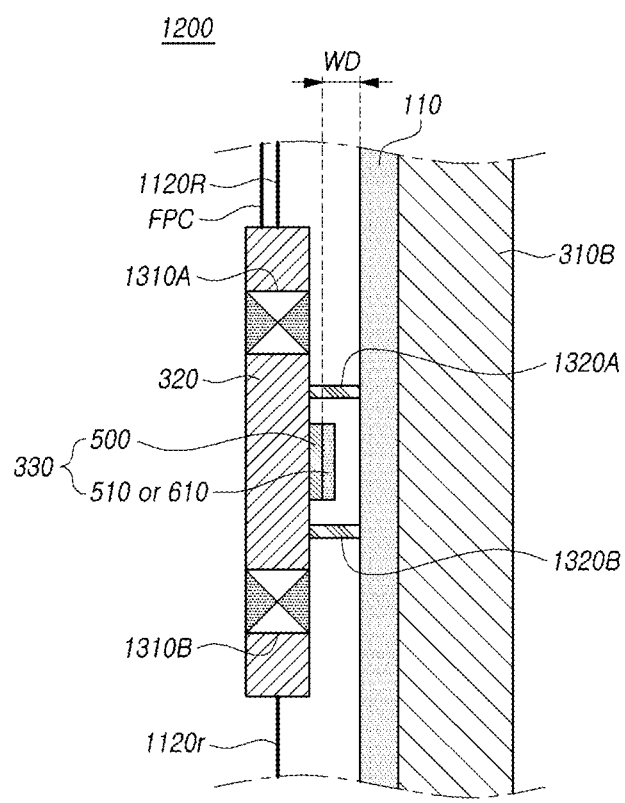
FIG. 13 is a diagram for describing a gap maintaining device included in the first movement actuator device of the display device according to embodiments of the present disclosure.

FIG. 13 is an enlarged view of an area 1200 in which the moving bar 320 is located in FIG. 12. And FIG. 13 is a diagram for describing a gap maintaining device included in the first movement actuator device of the display device 100 according to embodiments of the present disclosure.

Referring to FIG. 13, the first moving actuator device of the display device 100 according to embodiments of the present disclosure may include a gap maintaining device. The distance maintaining device may maintain a gap between the plurality of sensor modules 330 mounted on the moving bar 320 and the viewing surface of the display panel 110 at a preset operable gap WD.

Referring to FIG. 13, the gap maintaining device may be included in the moving bar 320. The space maintaining device may include at least one fan device 1310A, 1310B that sucks and discharges air in a space between the display panel 110 and the moving bar 320, and two or more spacers 1320A and 1320B protruding toward the display panel 110.

The at least one fan device 1310A and 1310B may suck air in a space between the display panel 110 and the moving bar 320 and discharge the air out of the space. Accordingly, at least one of the fan devices 1310A and 1310B generates a force so that the moving bar 320 approaches the display panel 110. Accordingly, the end portions of the two or more spacers 1320A and 1320B and the viewing surface of the display panel 110 may remain in contact with each other.

Accordingly, the gap between the plurality of sensor modules 330 mounted on the moving bar 320 and the viewing surface of the display panel 110 may be maintained at a preset operable gap WD.

On the other hand, as shown in FIG. 4, after the sensing operation is completed, when the moving bar 320 returns to the initial position P0, the at least one fan device 1310A and 1310B may rotate in the opposite direction so that the moving bar 320 may move away from the display panel 110 or may stop a fan operation.

Accordingly, the moving bar 320 can be easily moved, and at least two spacers 1320A and 1320B may be prevented from causing scratches on the viewing surface of the display panel 110.

Figure 14:
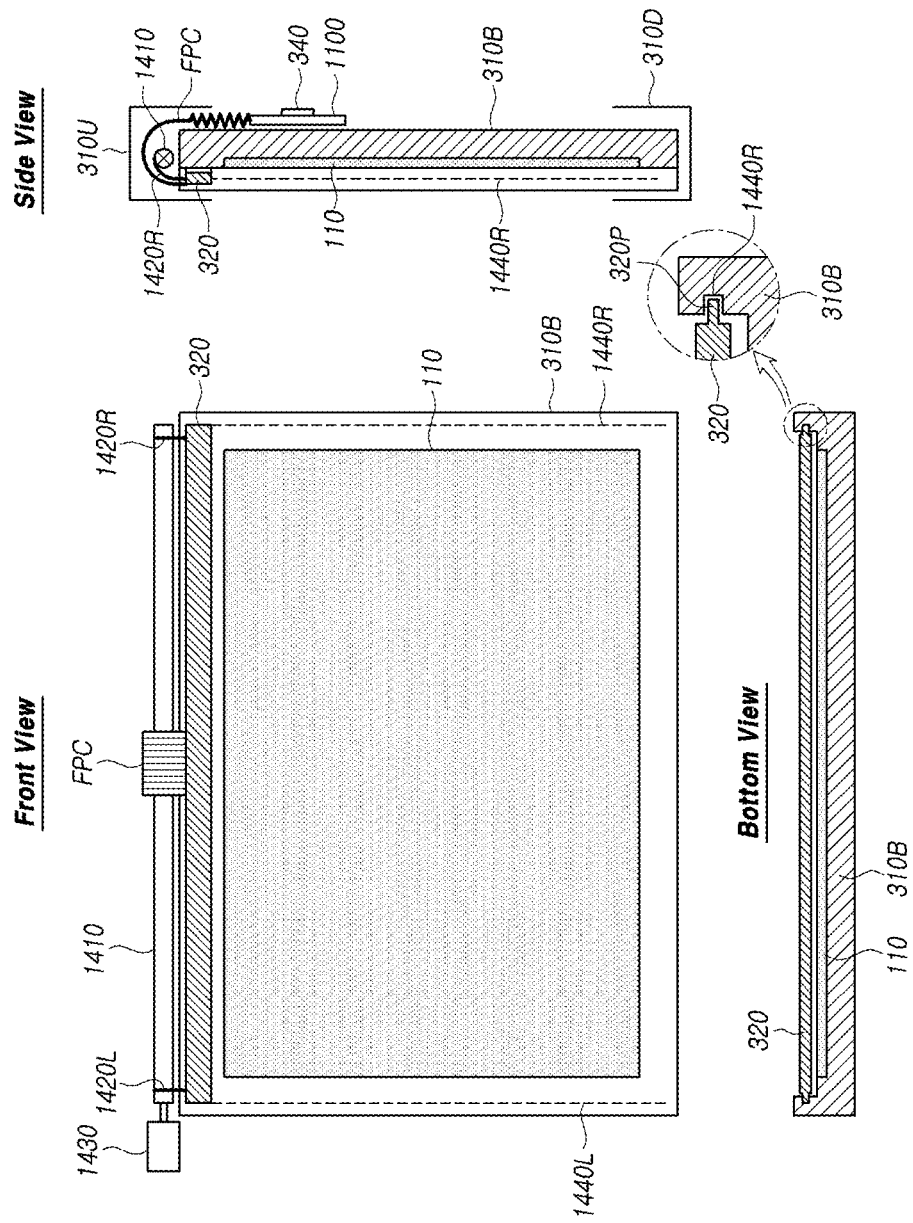
FIGS. 14 and 15 are diagrams illustrating a second movement actuator device for moving the moving bar and an operation thereof in the display device according to embodiments of the present disclosure.
Figure 15:
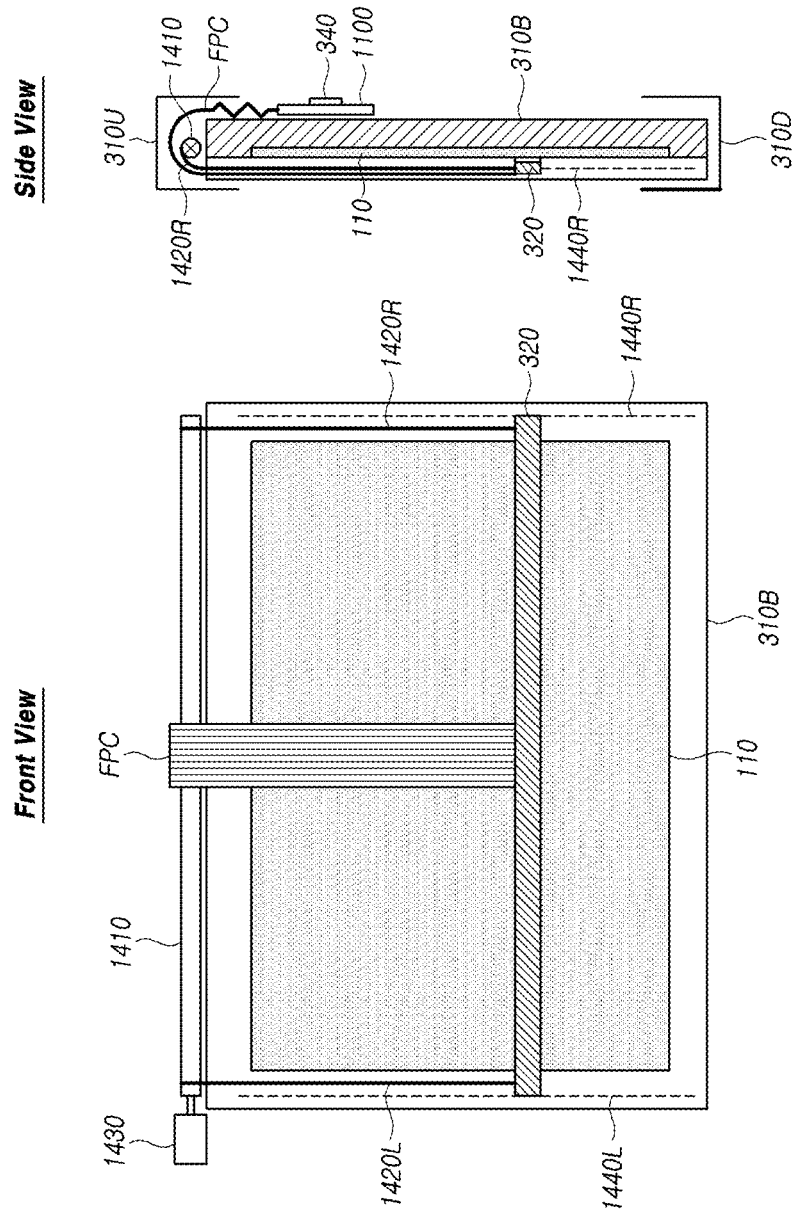

FIGS. 14 and 15 are diagrams illustrating a second movement actuator device for moving the moving bar 320 and an operation thereof in the display device 100 according to embodiments of the present disclosure. FIG. 14 is a diagram showing a front view, a side view and a bottom view when the moving bar 320 is located at an initial position P0, and FIG. 15 is a diagram illustrating a front view and a side view when the moving bar 320 is moved.

Referring to FIGS. 14 and 15, the second movement actuator device for moving the moving bar 320 in the display device 100 according to the embodiments of the present disclosure may include a shaft 1410, at least one wire 1420L and/or 1420R, a motor 1430, and the like.

The shaft 1410 may be installed on the upper side of the display panel 110. The shaft 1410 may be located inside the upper cover 310U of the housing 310. The shaft 1410 may be installed to be rotatable.

Each of the at least one wire 1420L and 1420R may include a first end coupled to the moving bar 320 and a second end coupled to the shaft 1410.

The motor 1430 may rotate the shaft 1410. The motor 1430 may be installed inside the upper cover 310U of the housing 310.

The moving bar 320 is coupled to at least one wire 1420L and 1420R. Accordingly, when at least one of the wires 1420L and 1420R is wound or unwound on the shaft 1410, the moving bar 320 also rises or descends.

Referring to FIGS. 14 and 15, as the shaft 1410 is rotated in the first direction by the motor 1430 in order to perform the sensing operation, the wires 1420L and 1420R are unwound from the shaft 1410, so that the moving bar 320 may descend.

Referring to FIGS. 14 and 15, after the sensing operation is completed, the display device 100 may return to the state of FIG. 14. As the shaft 1410 rotates in a second direction opposite to the first direction by the motor 1430, the wires 1420L and 1420R are wound around the shaft 1410, so that the moving bar 320 may rise.

Referring to FIGS. 14 and 15, the display device 100 according to embodiments of the present disclosure may further include a printed circuit board 1100 and a flexible cable. The printed circuit board 1100 may be coupled to the back cover 310B of the housing 310. A sensing controller 340 may be mounted on the printed circuit board 1100. The flexible cable may be connected to the printed circuit board 1100 and the moving bar 320.

For example, the flexible cable may be a flexible printed circuit (FPC) or a flexible flat cable (FFC). In FIGS. 14 and 15, as an example, a flexible cable is shown as a flexible printed circuit (FPC).

In the second moving actuator device of the display device 100 according to embodiments of the present disclosure, in order to maintain the gap (distance) between the plurality of sensor modules 330 mounted on the moving bar 320 and the viewing surface of the display panel 110 at a preset operable gap WD, the housing 310 may include at least one guide groove 1440L and/or 1440R.

Referring to FIG. 14, the back cover 310B of the housing 310 may include at least one guide groove 1440L and/or 1440R through which at least one 320P of the first end and the second end of the moving bar 320 is inserted to guide the sliding of the moving bar 320.

Accordingly, the gap between the plurality of sensor modules 330 mounted on the moving bar 320 and the viewing surface of the display panel 110 may be maintained at a preset operable gap WD.

Figure 16:
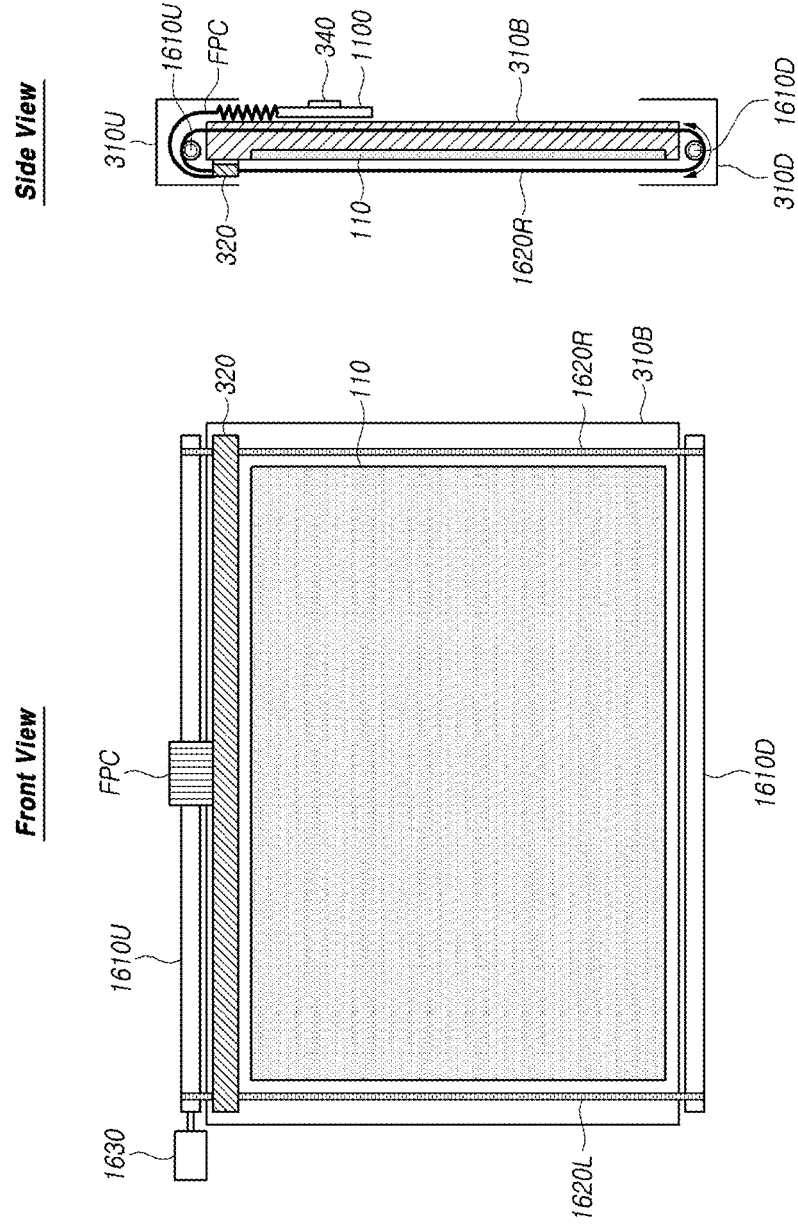
FIGS. 16 and 17 are diagrams illustrating a third movement actuator device for moving the moving bar and an operation thereof in the display device according to embodiments of the present disclosure.
Figure 17:
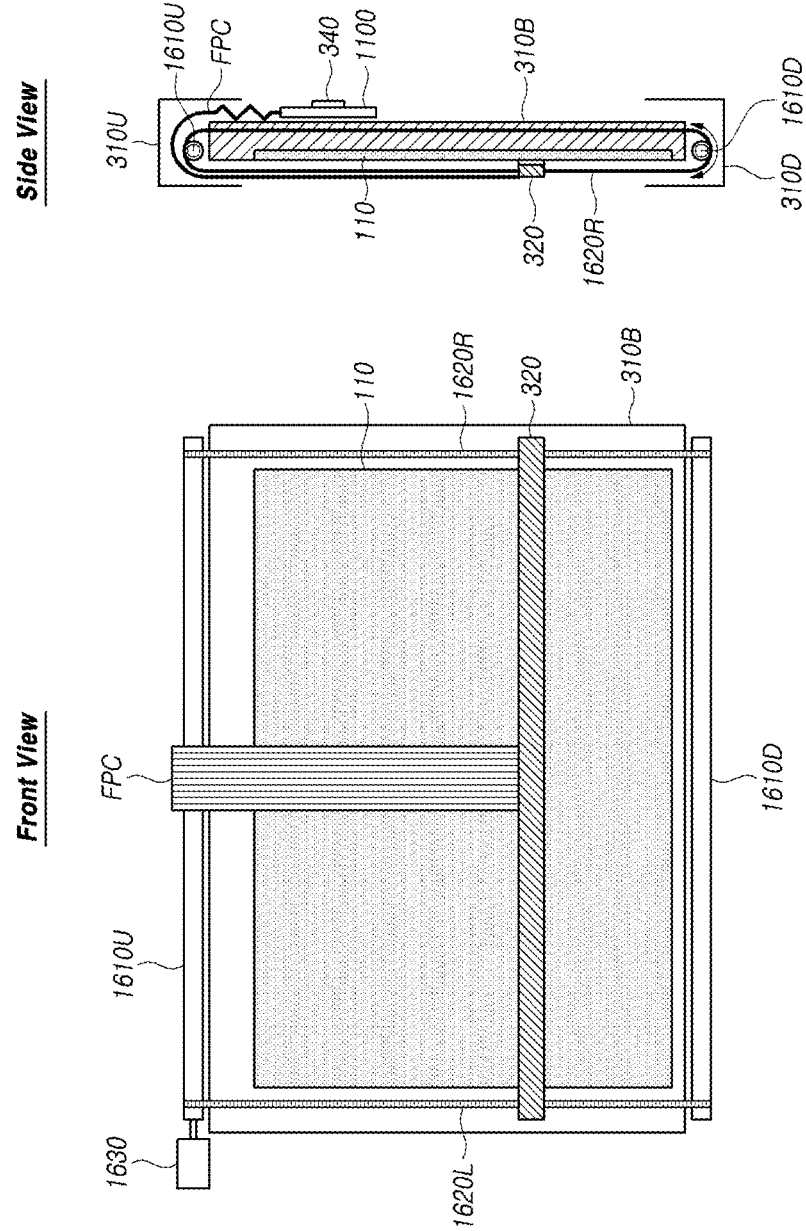

FIGS. 16 and 17 are diagrams illustrating a third movement actuator device for moving the moving bar 320 and an operation thereof in the display device 100 according to embodiments of the present disclosure. FIG. 16 is a diagram showing a front view and a side view when the moving bar 320 is located at an initial position P0, and FIG. 17 is a diagram illustrating a front view and a side view when the moving bar 320 is moved.

Referring to FIGS. 16 and 17, the display device 100 according to embodiments of the present disclosure may include a third movement actuator device for moving the moving bar 320. The third movement actuator device may include a first shaft 1610U, a second shaft 1610D, at least one conveyor 1620L and/or 1620R, a motor 1630, and the like.

The first shaft 1610U may be installed on upper side of the display panel 110. The first shaft 1610U may be located inside the upper cover 310U of the housing 310. The first shaft 1610U may be installed to be rotatable.

The second shaft 1610D may be installed on the lower side of the display panel 110. The second shaft 1610D may be located inside the lower cover 310D of the housing 310. The second shaft 1610D may be installed to be rotatable.

Each of the conveyors 1620L and 1620R may be installed on one of the left and right sides of the display panel 110. Each of the conveyors 1620L and 1620R may be wound and rotated around one end of the first shaft 1610U and one end of the second shaft 1610D. For example, each conveyor 1620L, 1620R may be a belt type, a chain type, or the like.

Each of the conveyors 1620L and 1620R may be coupled to a moving bar 320. Accordingly, each of the conveyors 1620L and 1620R and the moving bar 320 may move together.

The motor 1630 may rotate the first shaft 1610U or the second shaft 1610D. The motor 1630 may be installed inside the upper cover 310U of the housing 310.

Referring to FIGS. 16 and 17, in order to perform a sensing operation, the first shaft 1610U or the second shaft 1610D may be rotated in the first direction by the motor 1630. Accordingly, the conveyors 1620L and 1620R rotate, and the moving bar 320 coupled to the conveyors 1620L and 1620R may descend.

Referring to FIGS. 16 and 17, after the sensing operation is completed, the display device 100 may return to the state of FIG. 16. To this end, the first shaft 1610U or the second shaft 1610D may be rotated in a second direction opposite to the first direction by the motor 1630. Accordingly, the conveyors 1620L and 1620R rotate in opposite directions, and the moving bar 320 coupled to the conveyors 1620L and 1620R may rise.

Referring to FIGS. 16 and 17, the display device 100 according to embodiments of the present disclosure may further include a printed circuit board 1100 and a flexible cable. The printed circuit board 1100 may be coupled to the back cover 310B of the housing 310. The sensing controller 340 may be mounted on the printed circuit board 1100. The flexible cable may be connected to the printed circuit board 1100 and the moving bar 320.

For example, the flexible cable may be a flexible printed circuit (FPC) or a flexible flat cable (FFC). In FIGS. 16 and 17, as an example, a flexible cable is shown as a flexible printed circuit (FPC).

Figure 18:
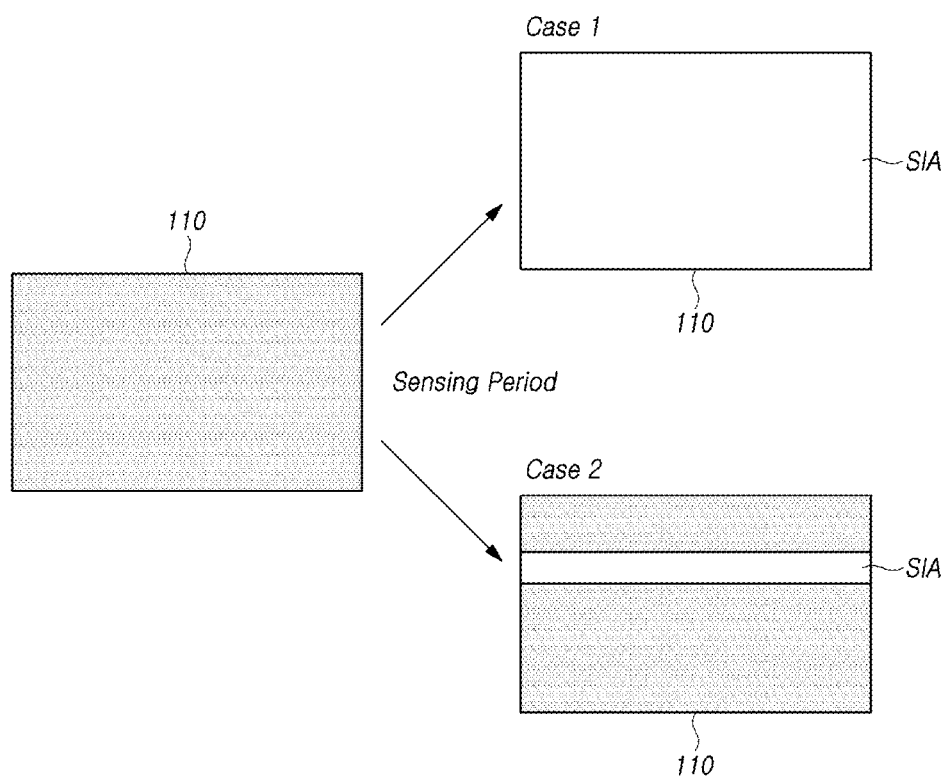
FIG. 18 is a diagram illustrating methods of displaying a sensing image on the display panel while a sensing operation is performed using the movable sensor structure in the display device according to embodiments of the present disclosure.

FIG. 18 is a diagram illustrating methods of displaying a sensing image on the display panel 110 while a sensing operation is performed using the movable sensor structure in the display device 100 according to embodiments of the present disclosure.

Referring to FIG. 18, before the sensing operation is performed, the display device 100 may be in a state (e.g., a standby state in which only standby power is supplied) in which an operation for displaying an image is not performed. Accordingly, the display panel 110 may be in a state in which an actual image is not displayed.

When timing for compensation is reached and a sensing operation is performed in the display device 100, a special sensing image required for the sensing operation may be displayed on the display panel 110.

When the sensing operation is performed in the display device 100, the display device 100 may display the sensing image on the display panel 110 in two ways (Case 1 and Case 2).

Referring to FIG. 18, as Case 1 of the sensing image display method, while the moving bar 320 is moving, the sensing image may be displayed on the entire area of the display panel 110.

Referring to FIG. 18, as Case 2 of the sensing image display method, while the moving bar 320 is moving, the sensing image may be displayed in an area of the display panel 110 corresponding to the moving position of the moving bar 320. That is, the sensing image may be displayed only in a partial area of the display panel 110, and the display position of the sensing image may be changed to correspond to the moving position of the moving bar 320.

Referring to FIG. 18, in case of Case 1, there is an advantage in that the display panel 110 can be easily driven during the sensing period. However, in case of Case 1, during the sensing period, the user can view the sensing image. In addition, when the plurality of sensor modules 330 senses the luminance of light emitted from the subpixels SP overlapping the moving bar 320, the luminance of light emitted from the subpixels SP that does not overlap with the moving bar 320 may also be mixed and sensed. Accordingly, the sensing accuracy may be slightly deteriorated.

Referring to FIG. 18, in case of Case 2, during the sensing period, the sensing image should be displayed only by the subpixels SP overlapping the moving bar 320 according to the movement of the moving bar 320. That is, the position where the sensing image is displayed must be changed. Therefore, the operations of the data driving circuit 120 and the gate driving circuit 130 may be complicated.

However, in case of Case 2, since the sensing image is covered by the moving bar 320 during the sensing period, there is an advantage that the user cannot see the sensing image. In addition, when the plurality of sensor modules 330 senses the luminance of light emitted from the subpixels SP overlapping the moving bar 320, light is not emitted from the subpixels SP that do not overlap the moving bar 320. Therefore, there is an advantage in that the sensing accuracy can be increased.

In the following, the movable sensor structure described above and a sensing and compensation system that performs sensing and compensation using the movable sensor structure are summarized.

Figure 19:
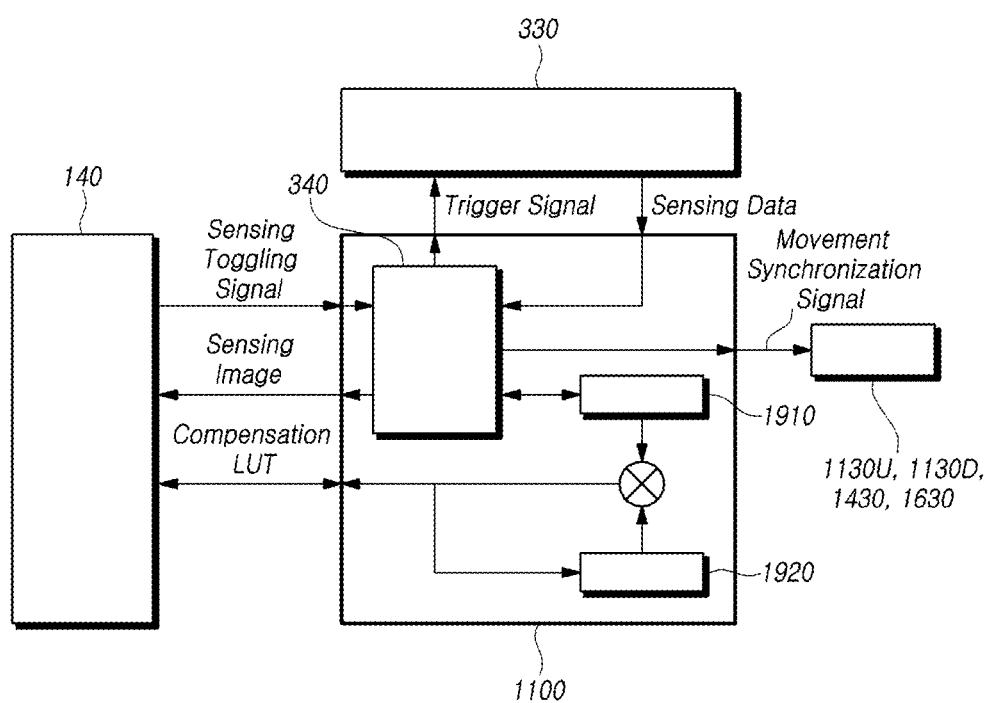
FIG. 19 is a diagram illustrating a sensing and compensation system using the movable sensor structure of the display device according to embodiments of the present disclosure.

FIG. 19 is a diagram illustrating a sensing and compensation system using the movable sensor structure of the display device 100 according to embodiments of the present disclosure.

Referring to FIG. 19, the sensing and compensation system using the movable sensor structure of the display device 100 according to embodiments of the present disclosure may include a plurality of sensor modules 330, one or more motors 1130U, 1130D, 1430, and 1630, a sensing controller 340, a display controller 140, and the like.

A plurality of sensor modules 330 may be disposed on the moving bar 320.

The motors 1130U, 1130D, 1430, and 1630 may provide power to move the moving bar 320.

The sensing controller 340 may be a device that controls a sensing and compensation function using a movable sensor structure. The sensing controller 340 may control sensing operations of the plurality of sensor modules 330. The sensing controller 340 may control the movement of the moving bar 320. The sensing controller 340 may control whether the motors 1130U, 1130D, 1430, and 1630 operate, or control the rotation direction or rotation speed of the motors 1130U, 1130D, 1430, and 1630.

The sensing controller 340 may be disposed on the printed circuit board 110.

For example, in case that a plurality of sensor modules 330 are implemented as a contact image sensor (CIS), the sensing controller 340 and the plurality of sensor modules 330 may communicate with each other through a camera link standard or the like.

The sensing controller 340 and the display controller 140 may communicate through an I2C (inter-integrated circuit) communication interface or a SPI (serial-parallel interface).

The display controller 140 may output a sensing toggling signal indicating a sensing possible time to the sensing controller 340.

When the sensing toggling signal is received, the sensing controller 340 may control the motors 1130U, 1130D, 1430, and 1630 and the plurality of sensor modules 330 so that the sensing operation may proceed. In addition, the sensing controller 340 may control the sensing image to be displayed on the display panel 110 when the sensing operation is in progress.

The sensing controller 340 may provide the sensing image to be displayed on the entire area or a partial area of the display area DA of the display panel 110 to the display controller 140.

When the display position of the sensing image moves according to the movement of the moving bar 320, the sensing controller 340 may provide location information of the moving bar 320 or panel location information (e.g., subpixel information, etc.) corresponding to the location of the moving bar 320 to the display controller 140.

Accordingly, the display controller 140 may control the gate driving circuit 130 and the data driving circuit 120 so that the sensing image is displayed in the area synchronized with the position of the moving bar 320.

The sensing controller 340 may control one or more of the moving speed and the moving direction of the moving bar 320 by controlling one or more of the rotation speed and rotation direction of the motors 1130U, 1130D, 1430, and 1630.

The moving speed of the moving bar 320 needs to be precisely controlled in consideration of the sensing speed of the plurality of sensor modules 330 and the geographic information (e.g., size and spacing of subpixels SP, etc.) of the subpixels SP. Accordingly, the sensing controller 340 may output a movement synchronization signal to the motors 1130U, 1130D, 1430, and 1630.

When the sensing operation of the plurality of sensor modules 330 is required, the sensing controller 340 may output a trigger signal that triggers the sensing operation of the plurality of sensor modules 330 to the plurality of sensor modules 330.

When each of the plurality of sensor modules 330 is a contact type image sensor (CIS), a time period during which the plurality of sensor modules 330 are exposed to light may be controlled by a trigger signal. That is, the sensing controller 340 may control the light exposure time of each of the plurality of sensor modules 330 through the trigger signal.

The sensing controller 340 may control the moving speed of the moving bar 320 based on the output period of the trigger signal.

Each of the plurality of sensor modules 330 may sense the luminance of light by performing a sensing operation according to a trigger signal, and transmit sensing values (sensing data) for the luminance to the sensing controller 340 in a wired manner or a wireless manner The sensing controller 340 may receive sensing values for luminance from each of the plurality of sensor modules 330, and may store the received sensing values or corresponding information thereof in the compensation LUT (look-up table).

In more detail, the sensing controller 340 may receive sensing values (sensing data) for luminance from each of the plurality of sensor modules 330 and generate a luminance map (luminance distribution data) 1910 based on the received sensing values. The sensing controller 340 may compare the luminance map (luminance distribution data) 1910 generated through the sensing result with the reference luminance map (reference luminance distribution data) 1920 stored in advance to determine the amount of change in luminance of each of the plurality of subpixels SP. The sensing controller 340 may calculate a compensation value capable of reducing or removing a luminance deviation between the plurality of subpixels SP, based on the amount of change in luminance determined for each of the plurality of subpixels SP. The sensing controller 340 may store the calculated compensation value (compensation information) in the compensation LUT or change compensation value (compensation information) previously stored in the compensation LUT into the calculated compensation value (compensation information). Here, the reference luminance map (reference luminance distribution data) 1920 may be data stored in the compensation LUT.

Figure 20A:
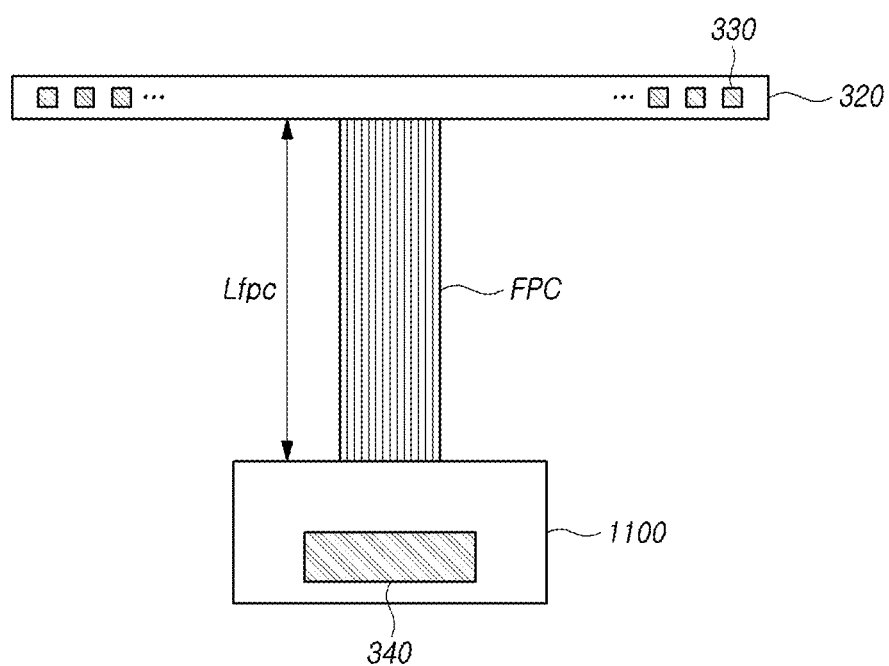
FIGS. 20A and 20B are diagrams illustrating a wired communication method and a wireless communication method between the plurality of sensor modules and the sensing controller in the display device according to embodiments of the present disclosure.
Figure 20B:
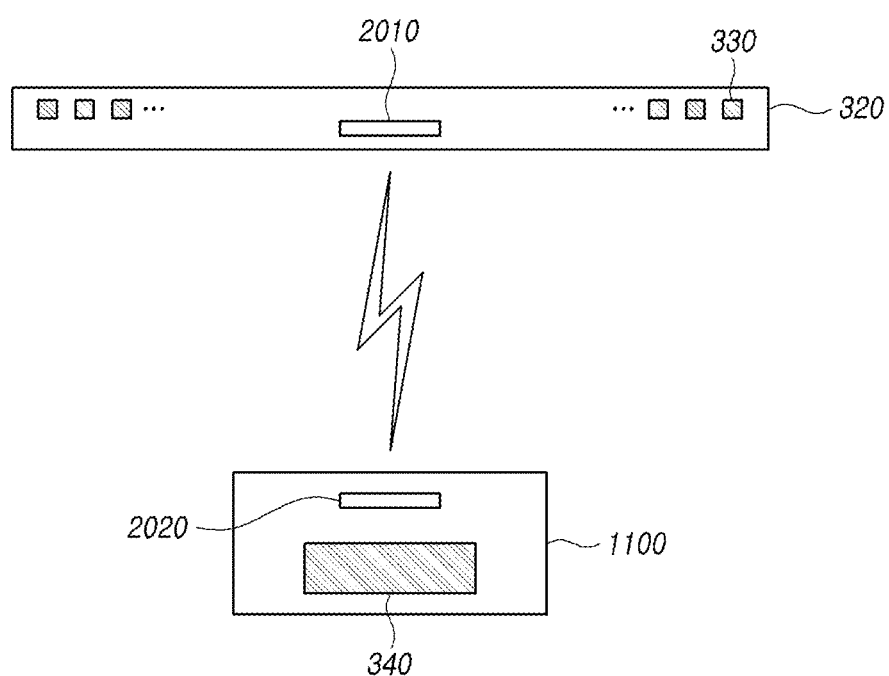

FIGS. 20A and 20B are diagrams illustrating a wired communication method and a wireless communication method between the plurality of sensor modules 330 and the sensing controller 340 in the display device 100 according to embodiments of the present disclosure.

Referring to FIG. 20A, the plurality of sensor modules 330 mounted on the moving bar 320 and the sensing controller 340 may communicate in a wired manner In this case, as described above, the display device 100 according to embodiments of the present disclosure may include a printed circuit board 1100 on which the sensing controller 340 is mounted and coupled to the housing 310, and a flexible cable connecting the printed circuit board 1100 and the moving bar 320. For example, the flexible cable may be a flexible printed circuit (FPC) or a flexible flat cable (FFC). However, in FIG. 20A, as an example, a flexible cable is shown as a flexible printed circuit (FPC).

Referring to FIG. 20A, the length (Lfpc) of the flexible cable such as a flexible printed circuit (FPC) or a flexible flat cable (FFC) may be greater than or equal to the maximum moving distance (Dmax in FIG. 11) of the moving bar 320. Accordingly, while the moving bar 320 is moving, the flexible cable may maintain the connection between the moving bar 320 and the printed circuit board 1100.

Referring to FIG. 20B, a plurality of sensor modules 330 mounted on the moving bar 320 and the sensing controller 340 may communicate in a wireless manner In this case, the display device 100 according to embodiments of the present disclosure may include a first communication module 2010 mounted on the moving bar 320 and transmitting sensing values of each of the plurality of sensor modules 330, and a second communication module 2020 that receives a sensing value from the first communication module 2010 and transmits it to the sensing controller 340.

The first communication module 2010 and the second communication module 2020 may communicate with a short-range wireless method such as Bluetooth. Alternatively, the first communication module 2010 and the second communication module 2020 may communicate in a wireless communication method using an access point, such as a WiFi (Wireless Fidelity) method.

When the plurality of sensor modules 330 mounted on the moving bar 320 and the sensing controller 340 communicate in a wireless manner, the sensing controller 340 may communicate with an external server through an access point. The sensing controller 340 may communicate with an external server to receive reference information (e.g., reference luminance, etc.) for calculating a compensation value.

Figure 21:
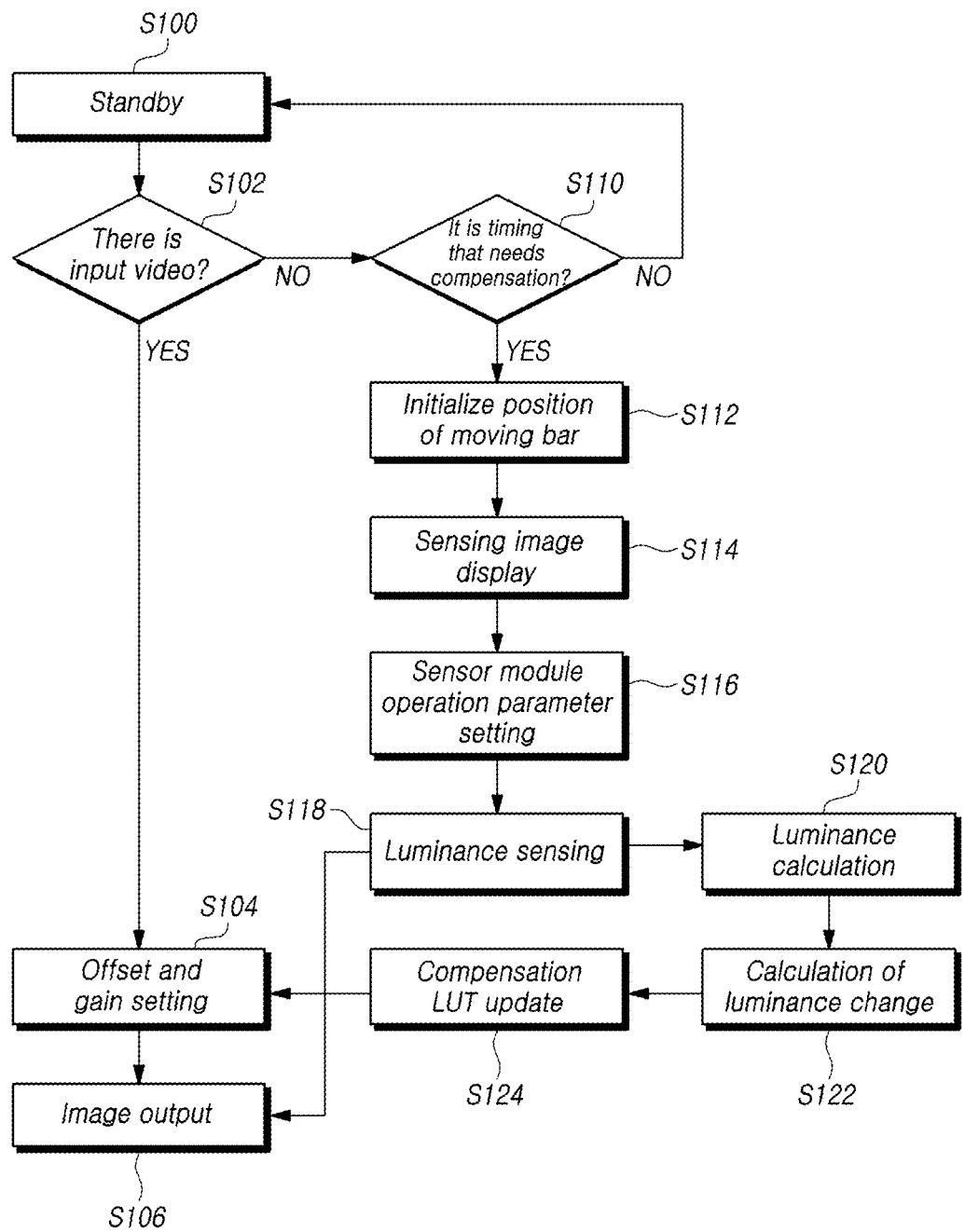
FIG. 21 is a flowchart of a compensation method using the movable sensor structure of the display device according to embodiments of the present disclosure.

FIG. 21 is a flowchart of a compensation method using the movable sensor structure of the display device 100 according to embodiments of the present disclosure.

Referring to FIG. 21, during the standby state (S100), the display controller 140 may determine whether an image signal (video signal) is input from the host module 150 (S102).

When the display controller 140 determines that the image signal is input from the host module 150 as a result of the determination in step S102, the display controller 140 may perform a data change process by setting compensation values (e.g., offset, gain, etc.) stored in the compensation LUT (S104). Thereafter, the display controller 140 may control an image to be output on the display panel 110 by using the changed data (S106).

Referring to FIG. 21, when the display controller 140 determines that the video signal is not input from the host module 150 as a result of the determination in step S102, the display controller 140 or the sensing controller 340 may determine whether a timing for compensation is required (S110). In this case, the display controller 140 or the sensing controller 340 may determine whether timing for compensation is required based on current time information, previous compensation time information, and compensation period information.

In step S110, if the display controller 140 or the sensing controller 340 does not determine that the compensation is required, the display controller 140 performs a state change to the standby state and waits for a predetermined time (S100).

In step S110, if the display controller 140 or the sensing controller 340 determines that the compensation is required, the sensing controller 340 may initialize the position of the moving bar 320 to the initial position P0 (S112). And, the sensing controller 340 may control a sensing image to be displayed on the display panel 110 (S114).

In addition, the sensing controller 340 may set a sensor module driving parameter (operation parameter) (S116). Here, the sensor module driving parameter may be movement control information (e.g., movement speed, movement direction, etc.) of the moving bar 320, sensing operation information (e.g., trigger time, trigger period, light exposure time, etc.) of the sensor module 330, and the like.

In FIG. 21, although it is illustrated as being executed in the order of steps S112, S114, and S116, the execution order of steps S112, S114, and S116 can be freely changed.

In FIG. 21, the steps S112, S114, and S116 may be steps performed before or immediately after the movement of the moving bar 320 actually starts. The steps S112, S114, and S116 may be preprocessing steps before the sensing operation of the plurality of sensor modules 330 is executed.

After the steps S112, S114, and S116 are executed, the moving bar 320 may move and the luminance sensing may be performed by the plurality of sensor modules 330 mounted on the moving bar 320 (S118).

While the moving bar 320 moves from the top to the bottom of the display area DA of the display panel 110, the plurality of sensor modules 330 may perform luminance sensing for the entire area of the display area DA. After completion of the luminance sensing, the sensing controller 340 may calculate luminance for a plurality of subpixels SP using sensing data (sensing values) received from the plurality of sensor modules 330 (S120).

The sensing controller 340 may compare the calculated luminance values for the plurality of subpixels SP with the reference luminance stored in advance, and calculate the amount of change in luminance for the plurality of subpixels SP (S122).

The sensing controller 340 may update the compensation LUT by calculating compensation values for the plurality of subpixels SP based on the amount of luminance change calculated for the plurality of subpixels SP (S124).

Figure 22:
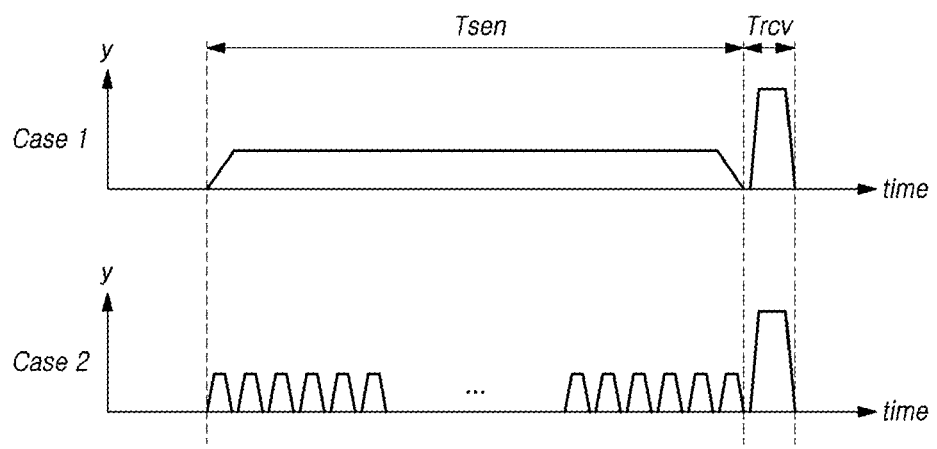
FIG. 22 is a diagram for describing methods of controlling a moving speed of the moving bar in a structure of the movable sensor of the display device according to embodiments of the present disclosure.

FIG. 22 is a diagram for describing methods of controlling a moving speed of a moving bar 320 in a movable sensor structure of the display device 100 according to embodiments of the present disclosure. However, the speed y in FIG. 22 is expressed as an absolute value.

Referring to FIG. 22, in case 1, the moving bar 320 may move at a constant speed during the sensing period Tsen. In this case, the moving speed of the moving bar 320 may be slower than the sensing speed of each of the plurality of sensor modules 330.

Referring to FIG. 22, in case of Case 2, the moving speed of the moving bar 320 may increase or decrease according to the operation of the plurality of sensor modules 330. That is, when the moving bar 320 is close to a position where the sensing operation of the plurality of sensor modules 330 should be performed (the position of the subpixel row), the moving speed of the moving bar 320 decreases. When the moving bar 320 moves again after the sensing operation of the plurality of sensor modules 330 is performed, the moving speed of the moving bar 320 may increase again.

Referring to FIG. 22, in the case of Cases 1 and 2, after the sensing period Tsen ends, during the period Trcv in which the moving bar 320 returns to the initial position P0, the moving bar 320 may move to the initial position P0 at a higher speed than the moving speed of the moving bar 320 during the sensing period Tsen.

According to aspects of the present disclosure, it is possible to provide a display device that senses luminance of subpixels and compensates for luminance deviations of subpixels without a complicated subpixel structure and a complicated signal wiring structure, and without performing complicated sensing driving.

According to aspects of the present disclosure, it is possible to provide a display device having a movable sensor structure outside a display panel and performing an accurate compensation function by using the movable sensor structure.

According to aspects of the present disclosure, it is possible to provide a display device including a display panel having a high aperture ratio and high resolution by sensing luminance of subpixels and compensating for luminance deviations of subpixels without a complicated subpixel structure and a complicated signal wiring structure.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
   a display panel including a plurality of data lines, a plurality of gate lines, and a plurality of subpixels, each of the plurality of subpixels including a light emitting device and a driving transistor;
   a housing protecting the display panel;
   a moving bar installed in the housing, the moving bar configured to be movable and moving at a front of a viewing surface of the display panel;
   a plurality of sensor modules mounted on the moving bar, the plurality of sensor modules facing the viewing surface of the display panel; and
   a sensing controller configured to control movement of the moving bar, control an operation of the plurality of sensor modules, and receive sensing values of each of the plurality of sensor modules.

2. The display device according to claim 1, further comprising a data driving circuit configured to drive the plurality of data lines and a display controller configured to supply image data to the data driving circuit based on the image signal input from a host module, and
   when the image signal is not supplied from the host module to the display controller, the moving bar moves and the plurality of sensor modules operate.

3. The display device according to claim 1, further comprising a moving actuator device configured to move the moving bar up and down at the front of the viewing surface of the display panel.

4. The display device according to claim 3, wherein the moving actuator device comprises:
   a first shaft installed on an upper side of the display panel;
   a second shaft installed on a lower side of the display panel;
   a first wire having a first end coupled to a left side of the first shaft and a second end coupled to a left side of the second shaft to interlock the first shaft and the second shaft;
   a second wire having a first end coupled to a right side of the first shaft and a second end coupled to a right side of the second shaft to interlock the first shaft and the second shaft;
   a first motor rotating the first shaft; and
   a second motor rotating the second shaft,
   wherein a left side of the moving bar is coupled to the first wire, a right side of the moving bar is coupled to the second wire,
   wherein as the second shaft rotates by the second motor, the first wire and the second wire are wound around the second shaft, and the moving bar descends, and
   wherein as the first shaft rotates by the first motor, the first wire and the second wire are wound around the first shaft, and the moving bar rises.

5. The display device according to claim 4, wherein the moving bar comprises a gap maintaining device that maintains a gap between the plurality of sensor modules and the display panel, wherein the gap maintaining device comprises:

at least one fan device that sucks and discharges air in a space between the display panel and the moving bar; and two or more spacers protruding toward the display panel.

6. The display device according to claim 3, wherein the moving actuator device comprises:

a shaft installed on an upper side of the display panel;

a wire having a first end coupled to the moving bar and a second end coupled to the shaft; and a motor that rotates the shaft, wherein as the shaft rotates in a first direction by the motor, the wire is unwound from the shaft, and the moving bar descends, wherein as the shaft rotates in a second direction opposite to the first direction by the motor, the wire is wound around the shaft, and the moving bar rises, and wherein the housing comprises at least one guide groove through which at least one of a first end and a second end of the moving bar is inserted to guide sliding of the moving bar.

7. The display device according to claim 3, wherein the moving actuator device comprises:

a first shaft installed on an upper side of the display panel;

a second shaft installed on a lower side of the display panel;

a conveyor installed on one of a left side and a right side of the display panel, wound around a first end of the first shaft and a first end of the second shaft and rotated, and coupled to the moving bar; and a motor that rotates the first shaft or the second shaft, wherein as the first shaft or the second shaft rotates in a first direction by the motor, the conveyor rotates, and the moving bar coupled to the conveyor descends, and wherein as the first shaft or the second shaft rotates in a second direction opposite to the first direction by the motor, the conveyor rotates in an opposite direction, and the moving bar coupled to the conveyor rises.

8. The display device according to claim 1, further comprising:

a printed circuit board on which the sensing controller is mounted and coupled to the housing; and a flexible cable connecting the printed circuit board and the moving bar.

9. The display device according to claim 8, wherein a length of the flexible cable is greater than or equal to a maximum moving distance of the moving bar.

10. The display device according to claim 1, further comprising:

a first communication module mounted on the moving bar, the first communication module transmitting sensing values of each of the plurality of sensor modules; and a second communication module receiving the sensing values from the first communication module and transmitting the sensing values to the sensing controller.

11. The display device according to claim 1, wherein each of the plurality of sensor modules comprises:

a luminance sensor configured to sense a luminance of a point located on the viewing surface of the display panel according to the movement of the moving bar; and a light controller positioned between the display panel and the luminance sensor, in which light emitted from the display panel is incident, and light within a predetermined angle with a vertical direction of the display panel is output.

12. The display device according to claim 11, wherein the light controller comprises at least one of a first light control film that filters light in a first direction and a second light control film that filters light in a second direction that crosses the first direction.

13. The display device according to claim 11, wherein the light controller comprises an optical filter including a transmissive layer and a non-transmissive layer, wherein the non-transmissive layer comprises at least one of a front non-transmissive layer positioned on a front surface of the transmissive layer and a rear non-transmissive layer positioned on a rear surface of the transmissive layer, and wherein a plurality of first slits are formed in the front non-transmissive layer, and a plurality of second slits are formed in the rear non-transmissive layer in a direction crossing the plurality of first slits.

14. The display device according to claim 1, wherein the plurality of subpixels comprise a plurality of subpixel rows, wherein a horizontal length of the moving bar is greater than or equal to a row direction length of one subpixel row among the plurality of subpixel rows, and wherein a vertical length of the moving bar is greater than or equal to a column length of one subpixel row among the plurality of subpixel rows or greater than or equal to a column direction lengths of two or more subpixel rows among the plurality of subpixel rows.

15. The display device according to claim 1, wherein at one time point in a period during which the moving bar moves, one of the plurality of subpixels overlaps with one of the plurality of sensor modules.

16. The display device according to claim 1, wherein at one time point in a period during which the moving bar moves, one of the plurality of subpixels overlaps with two or more of the plurality of sensor modules.

17. The display device according to claim 1, wherein the sensing controller is configured to:

control display of a sensing image on the display panel, control at least one of a moving speed and a moving direction of the moving bar, control a sensing operation of each of the plurality of sensor modules, receive sensing values for luminance from each of the plurality of sensor modules, and store information in a look-up table or change information previously stored in the look-up table based on the sensing values received from each of the plurality of sensor modules.

18. The display device according to claim 17, wherein while the moving bar is moving, the sensing image is displayed on an entire area of the display panel.

19. The display device according to claim 17, wherein while the moving bar is moving, an area in which the sensing image is displayed on the display panel moves according to a movement of the moving bar.

20. The display device according to claim 1, wherein at a first time point, the moving bar overlaps a first area of the display panel, wherein at a second time point after the first time point, the moving bar overlaps a second area of the display panel different from the first area, wherein at the first time point, a first sensor module among the plurality of sensor modules mounted on the moving bar senses a first luminance of light emitted from n first subpixels located in the first area among the plurality of subpixels, where n is a natural number of 1 or more, and wherein at the second time point, the first sensor module among the plurality of sensor modules mounted on the moving bar senses a second luminance of light emitted from m second subpixels located in the second area among the plurality of subpixels, where M is a natural number of 1 or more, and is the same as or different from n.

* * * * *